United States Patent
Bednorz et al.

(10) Patent No.: US 8,688,181 B1
(45) Date of Patent: Apr. 1, 2014

(54) SUPERCONDUCTIVE COMPOUNDS HAVING HIGH TRANSITION TEMPERATURE, AND METHODS FOR THEIR USE AND PREPARATION

(75) Inventors: Johannes Georg Bednorz, Wolfhausen (CH); Carl Alexander Mueller, Hedingen (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/303,561

(22) Filed: Sep. 9, 1994

Related U.S. Application Data

(60) Continuation of application No. 08/060,470, filed on May 11, 1993, now abandoned, which is a continuation of application No. 07/875,003, filed on Apr. 24, 1992, now abandoned, which is a division of application No. 07/053,307, filed on May 22, 1987, now abandoned.

(30) Foreign Application Priority Data

Jan. 23, 1987 (EP) .................................... 87100961

(51) Int. Cl.
*H01B 12/00* (2006.01)
*H01L 39/12* (2006.01)

(52) U.S. Cl.
USPC ............ 505/150; 505/163; 505/166; 505/211

(58) Field of Classification Search
USPC ...................... 505/1, 725, 776–780, 126, 238, 505/150–213, 300, 825, 884–887; 252/518, 252/518.1–521.1
See application file for complete search history.

(56) References Cited

U.S. PATENT DOCUMENTS 3,472,779 A * 10/1969 Kurihara ...................... 252/62.9

OTHER PUBLICATIONS

Rao "High Tc Superconductivity in Quasi, two-dimensional . . . " Current Science v. 56 Jan. 20, 1987 p. 47-49.*
Ganguly "High Tc Superconductivity in oxides derived from $La_{1-8}Sr_{0.2}C_uO_4$" Proc. Indian Acad. Sci V. 97 (5+6) 1987 p. 631-633.*
Uchida "High Tc superconductivity of La—Ba—Cu oxides" Jap. Jnl. Appl. Phys. v. 26 (1) Jan. 1987 p. L1-L2.*

(Continued)

Primary Examiner — Mark Kopec
(74) Attorney, Agent, or Firm — Daniel P. Morris

(57) ABSTRACT

A new class of superconducting compositions, and methods for making and using them are described. These compositions exhibit superconductivity at temperatures in excess of 26° K. and are comprised of transition metal oxides having at least one additional element therein which may create a multivalent state of the transition metal oxide. The composition can be a ceramic-like material having a layer-like crystalline structure, where the structure is distorted having either an oxygen excess or deficiency. An example is RE-AE-TM-O, where RE is a rare earth or rare earth-like element, AE is an alkaline earth element, TM is a transition metal element (such as Cu) and O is oxygen.

521 Claims, 3 Drawing Sheets

(56) References Cited

OTHER PUBLICATIONS

Cava "Bulk Superconductivity at 36K in $La_{1-8}Sr_{0.2}C_uO_4$" *Phys. Rev. Lett.* v. 58 (4) Jan. 26, 1987 p. 408-410.*
Nguyen "Oxygen Defect $K_2NiF_4$-type oxides : . . ." *Jnl. of Solid State Chem.* v. 39 1981 p. 120-127.*
Shaplygin "Preparation and Properties of the compounds . . ." *Russian Jnl. of Inorg. Chem* v.24(6) 1979 p. 820-4.*
Bednorz "Phase diagram of the $(LaAlO_3)_{1-x}(Srt: O_3)_x$ . . ." *Mat. Res. Bull.* v. 18 1983 p. 181-187.*
Perron-Simon "Chimie dos solides" *C.R. Acad. Sc. Paris*, t. 283 1976 p. 33-35.*
Mossner "$Ba_6B_{0.5}Nb_{4.5}O_{18}$ (B=Sc, Y, In . . . ) . . ." *Journal of the Less Common Metals* v. 105 1985 p. 165-168.*
Chicholkar "Thermal behavior of compositions in . . ." *Thermal Analysis*, 6th, vol. 2 1980 p. 251-6.*
Ahmad "Effect of environmental cations on force . . ." *Spectroscopy Letters* v. 9 (1) 1976 p. 39-55.*
Blasse "Electronic, and Vibrational Spectra of Ordered Perovskites" *Jnl. of Solid State Chem.* v. 6 1973 p. 513-518.*
Anderton "Production of conducting oxide powders . . ." *Powder Met.* No. 1 1979 p. 14-21.*
Ogushi "Possibility of Superconductivity with High Tc . . ." *J. of Low Temp. Physics.* v. 69 (5,6) 1987 p. 451-7.*
J. B. Goodenough and J. M. Longo, *Magnetic and Other Properties of Oxides and Related Compounds*, in Landolt-Bornstein New Series, vol. III/4a, K.-H. Hellwege and A. M. Hellwege, eds. (Springer-Verlag 1970), pp. 261-314.
P. W. Anderson, *Comments on Solid State Physics*, vol. II, pp. 193-197 (Feb./Mar. 1970).
R. Englman, *The Jahn-Teller Effect in Molecules and Crystals*, (Wiley-Interscience, 1972), pp. 139-141, 164-181, 249-265.
B. K. Chakraverty, *Journal de Physique-Lettres*, vol. 40, pp. L-99-L-100, (Mar. 1979).
G. Deutscher et al. *Physical Review B*, vol. 21 pp. 5041-5047, (Jun. 1, 1980).
K. A. Muller et al. *Physical Review Letters*, vol. 45, 832-835, (Sep. 8, 1980).
R. A. Buhrman et al., in *AIP Conference Proceedings, Inhomogeneous Superconductors*—1979, (Berkeley Springs, W.V.), D. U. Gubser et al. pp. 207-215 (1980).
T. D. Thanh et al. *Applied Physics*, vol. 22, pp. 205-212 (1980).
C. Methfessel and S. Methfessel, in *Proceedings of the IV Conference on Superconductivity in d- and f-Band Metals*, W. Buckel and W. Weber, eds. (Kernforschungszentrum, Karlsruhe, 1982), pp. 393-399.
A. Baratoff et al., in *Proceedings of the IV Conference on Superconductivity in d- and f-Band Metals*, W. Buckel and W. Weber eds., (Kernforschungszentrum, Karlsruhe, 1982) p. 419.
J. Muller, Rep. Prog. Phys., vol. 43, pp. 642-687, (1980).
M. Suzuki et al., *Shinku* vol. 24, pp. 67-75, (1981). [in Japanese].
K. A. Muller et al., *Physical Review Letters*, vol. 47, pp. 138-142, (Jul. 13, 1981).
Y. Enomoto et al., Japanese Journal of Applied Physics, vol. 20, pp. L661-L664, (Sep. 1981).
B. K. Chakraverty, *Journal de Physique*, vol. 42, pp. 1351-1356, (Sep. 1981).
L. Er-Rakho et al., Journal of Solid State Chemistry, vol. 37, pp. 151-156, (1981).
A. Baratoff and G. Binnig, *Physica*, vol. 108B, pp. 1335-1336, (1981).
L. F. Mattheiss and D. R. Hamann, *Physical Review B*, vol. 26, pp. 2686-2689, (Sep. 1, 1982).
L. F. Mattheiss and D. R. Hamann, *Physical Review B*, vol. 28, pp. 4227-4241, (Oct. 15, 1983).
K.-H. Hock et al, *Helvetica Physica Acta*, vol. 56, pp. 237-243, (1983).
N. Nguyen et al., *Journal of the Physics and Chemistry of Solids*, vol. 44, pp. 389-400, (1983).
D. R. Bowman and D. Stroud, *Physical Review Letters*, vol. 52, pp. 299-302, (Jan. 23, 1984).
M. Tinkham et al., *Workshop on Problems in Superconductivity*, Copper Mountain, CO, pp. 12-22, (1984).
B. Batlogg, *Physica*, vol. 126B, pp. 275-279, (1984).
C. Ebner and D. Stroud, *Physical Review B*, vol. 31, pp. 165-171, (Jan. 1, 1985).
M. R. Harrison et al., *Philosophical Magazine B*, vol. 52, pp. 679-699, (1985).
E. Stocker and J. Buttet, *Solid State Communications*, vol. 53, pp. 915-917, (1985).
C. Van Haesendonck and Y. Bruynseraede, *Physical Review B*, vol. 33, pp. 1684-1690, (Feb. 1, 1986).
H. R. Ott, Unconventional Superconductivity, Zurich Physical Society Seminar, Zurich, (Feb. 13, 1986), [in German].
T. Ogushi and Y. Osono, *Applied Physics Letters*, vol. 48, pp. 1167-1168, (Apr. 28, 1986).
S.-I. Uchida et al. "High $T_c$ Superconductivity of La—Ba—Cu Oxides", unpublished nine-page manuscript bearing date of Nov. 22, 1986.
*Asahi Shinbum*, International Satellite Edition (London), Nov. 28, 1986, (in Japanese with English translation).
H. Takagi et al., "High-$T_c$ Superconductivity of La—Ba—Cu Oxides. II—Specification of the Superconducting Phase", unpublished nine-page manuscript bearing date of Dec. 8, 1986.
S.-I. Uchida et al., "High-$T_c$ Superconductivity of La—Ba—Cu Oxides. III—Electrical Resistivity Measurement" unpublished nine-page Manuscript (p. 7 missing) bearing date of Dec. 22, 1986.
Kishio et al., "New High Temperature Superconducting Oxides. $(La_{1-x}Sr_x)_2CuO_{4-\delta}$ and $(La_{1-x}Ca_x)_2Cu)_{4-\delta}$" unpublished four-page manuscript bearing date of Dec. 22, 1986.
C. W. Chu et al. "Superconductivity Above 52K in the La—Ba—Cu—O System" unpublished fourteen-page manuscript bearing date of Dec. 30, 1986.
W. Sullivan, *New York Times*, Dec. 31, 1986, p. A1, cols. 2-3 and A13, cols. 1-2.
S.-I. Uchida et al., "High-$T_c$ Superconductivity of La—Ba(Sr)—Cu Oxides. IV—Critical Magnetic Fields" unpublished ten-page manuscript bearing date of Jan. 8, 1987.
S. Kanbe et al., "Superconductivity and Lattice Parameters in $(La_{1-x}Sr_x)_2Cu)_{4-\delta}$ Solid Solution System" unpublished four-page manuscript bearing date of Jan. 13, 1987.
H. Takagi et al., Influence of the Oxygen Deficiency on the Electrical Resistivity in High-$T_c$ Superconducting Oxides $(LaBa)_2CuO_{4-y}$, unpublished eight-page manuscript bearing date of Jan. 17, 1987.
Z. Zhao et al., "High $T_c$ Superconductivity of Sr(Ba)La—Cu Oxides" unpublished eleven-page manuscript bearing date of Jan. 21, 1987.
Z. Phys. B—Condensed Matter 64, 189-193 (1986) "Possible High $T_c$ Super-conductivity in the Ba—La—Cu—O System" by J.G. Bednorz et al.
Revue de Chimie minerale, t.21, 1984, p. 407, "Oxygen Intercalation in Mixed Valence Copper Oxides Related to the Perovskites" by C. Michel et al.
Mat. Res. Bull., vol. 20, pp. 667-671, 1985 Pregamon Press Ltd, "The Oxygen Defect Perovskite $BaLa_4Cu_5O_{13.4}$, A Metallic Detector" by C. Michel et al.
Phys. Rev. Lett, vol. 45, No. 6, (Oct. 1980) "Two-Band Superconductivity in Nb-Doped $SrTiO_3$" by G. Binnig et al.
Jap. Journal of Appl. Phys. vol. 19, No. 5, May 1980 pp. L231-L234, "Preparation of Superconducting $BaPb_{1-x}Bi_xO_3$ Thin Films . . .", by M. Suzuki et al.
J. Appl. Phys. 53(3), Mar. 1982, pp. 1622-1630, "Preparation and Properties of Superconducting $BaPb_{1-x}Bi_xO_3$ Thin Films by Sputtering" by M. Suzuki et al.
Materials Research, Physics Today, Oct. 1984, pp. 60-68, "Superconducting Materials" by M. R. Beasley et al.
Solid State Communications, vol. 17, pp. 27-28, 1975, "High-Temperature Superconductivity in the $BaPb_{1-x}Bi_xO_3$ System" by A.W. Sleight et al.
Mat. Res. Bull. vol. 8, pp. 777-784, 1973, "High Temperature Superconductivity in the Li—Ti—O Ternary System" by D. C. Johnson et al.

(56) References Cited

OTHER PUBLICATIONS

Ibaraki Electrical Comm. Lab, "New Devices Using Superconducting $BaPb_{0.7}Bi_{0.3}O_3$ (BPB) Thin Films" by T. Murakami et al.

Jap. Journal of Appl. Phys, vol. 21, No. 7, Jul. 1982, pp. L437-L439, "Temperature Dependence of Max. DC Johnson Current through Grain Boundary Junctions in $BaPb_{0.75}Bi_{0.25}O_3$ Films" by MSuzuki et al.

Jap. Journal of Appl. Phys. vol. 21, No. 6, Jun. 1982, pp. L375-L376, "Hysteresis Loop in Current-Voltage Curve for $BaPb_{0.7}Bi_{0.3}O_3$ Josephson Junction Array in a Microwave Field" by M. Ito et al.

J. Vac. Sci Technol, 17(1) Jan./Feb. 1980,pp. 389-391, "Resputtering Effects in $Ba(Pb, Bi)O_3$ Perovskite"0 by L. R. Gilbert et al.

Thin Solid Films, 54,(1978) 129-136 "Superconducting $BaPb_{1-x}Bi_xO_3$ Ceramic Films Prepared by R.F. Sputtering" by L.R. Gilbert et al.

Proceeddings of the 13$^{th}$ Conf. on Solid State Devices, Tokyo, 1981 pp. 313-318 (Invited) New Materials for Josephson Junction Devices by T. Inamura et al.

Europhysics letters, 3(3),pp. 379-385(1987) "Susceptibility Measurements Support High-$T_c$ Superoncuctivity . . . " by J. G. Bednorz et al.

* cited by examiner

SUPERCONDUCTIVE COMPOUNDS HAVING HIGH TRANSITION TEMPERATURE, AND METHODS FOR THEIR USE AND PREPARATION

This application is a continuation of U.S. application Ser. No. 08/060,470 May 11, 1993 Abandoned, which is a continuation of U.S. application Ser. No. 07/875,003 Apr. 24, 1992 Abandoned, which is a Division of U.S. Ser. No. 07/053, 30 application Ser. No. 7 May 22, 1987 Abandoned.

This Application claims priority under 35 USC Section 119 to the application filed on 23 Jan. 1987 in the European Patent Office as European patent application Serial No. 87100961.9.

TECHNICAL FIELD

This invention relates to a new class of superconducting compositions having high superconducting transition temperatures and methods for using and preparing these compositions, and more particularly to superconducting compositions including copper and/or other transition metals, the compositions being characterized by a superconducting phase and a layer-like structure.

BACKGROUND ART

Superconductivity is usually defined as the complete loss of electrical resistance of a material at a well-defined temperature. It is known to occur in many materials, including about a quarter of the elements of the periodic table and over 1000 alloys and other multi-component systems. Generally, superconductivity is considered to be a property of the metallic state of a material since all known superconductors are metallic under the conditions that cause them to be superconducting. A few normally non-metallic materials, for example, become superconducting under very high pressure wherein the pressure converts them to metals before they exhibit superconducting behavior.

Superconductors are known to be very attractive for the generation and energy-saving transport of electrical power over long distances, and as materials used to form the coils of very strong magnets. These magnets are used in, for example, plasma and nuclear physics, nuclear magnetic resonance medical diagnosis systems, and in connection with the magnetic levitation of fast trains. Other potential uses of superconducting materials occur in power generation systems using thermonuclear fusion where very large magnetic fields must be provided, superconducting magnets being the only possible means for providing such high fields. In addition to these applications, superconductors are known in high speed switching devices, such as Josephson type switches, and in high density packaging and circuit layouts. Superconductors also are used in different types of electronic instrumentation, such as magnetic susceptometers and magnetometers.

While the advantages of superconductors are quite obvious to scientists and engineers, the common disadvantage of all presently known superconductive materials lies in their very low transition temperature. This temperature is often called the critical temperature $T_c$ and is the temperature above which superconductivity will not exist. Usually $T_c$ is on the order of a few degrees Kelvin. The element with the highest $T_c$ is niobium whose $T_c$ is 9.2° K. The composition having the highest previously known $T_c$ is $Nb_3Ge$ which exhibits a $T_c$ of about 23° K at ambient pressure. Transition metal alloy compounds of the A15($Nb_3Sn$) and Bl(NbN) structure have been shown to have high superconducting transition temperatures. Among the A15 compounds is the aforementioned composition $Nb_3Ge$. Some of these compositions are described in J. Muller, Rep. Prog. Phys. 43, 663 (1980), and M. R. Beasley et al, Phys. Today, 37 (10), 60 (1984).

It is known in the art that a small number of oxides will exhibit superconductivity. Reference is made to D. C. Johnston et al, Mat. Res. Bull. 8, 777 (1973), which describes high temperature superconductivity in the Li—Ti—O system with superconducting onsets as high as 13.7° K. These materials have multiple crystallographic phases including a spinel structure exhibiting the high $T_c$. Other metallic oxides, such as the perovskite Ba—Pb—Bi—O system, can exhibit superconductivity due to high electron-phonon coupling in a mixed valent compound, as described by G. Binnig et al, Phys. Rev. Lett., 45, 1352 (1980), and A. W. Sleight et al, Solid State Communications, 17, 27 (1975).

As is evident from the foregoing, superconductors presently known require liquid helium for cooling and this, in turn, requires an elaborate technology and a considerable investment in cost and energy. Accordingly, it is a primary object of the present invention to provide new compositions which exhibit high $T_c$ and methods for using and producing the same.

It is another object of the present invention to provide new superconducting compositions and methods for using and making them where cooling with liquid helium is not required in order to have superconductive properties in the compositions.

It is another object of the present invention to provide novel superconductive materials that are multi-valent oxides including transition metals, the compositions having a perovskite-like structure.

It is a further object of the present invention to provide novel superconductive compositions that are oxides including rare earth and/or rare earth-like atoms, together with copper or other transition metals that can exhibit mixed valent behavior.

It is a still further object of the present invention to provide novel superconductive compositions exhibiting high $T_c$, where the compositions are oxides including a phase having a layer-like structure and including copper.

It is a still further object of the present invention to provide new superconductive compositions exhibiting high $T_c$, where the superconductive compositions include layered structures including a rare earth and/or rare earth-like element and a transition metal.

It is another object of this invention to provide a new class of superconducting compositions characterized by a $T_c$ greater than 26° K, and methods for making and using these compositions.

It is another object of this invention to provide new compositions and methods for using them, where the compositions include a multi-valent oxide of copper and exhibit a $T_c$ greater than 26° K.

The basis for our invention has been described by us in the following previously published article: J. G. Bednorz and K. A. Muller, Zeitschrift fur Physik B—Condensed Matter, 64, pp. 189-193., (September 1986)

Another article of interest by us is J. G. Bednorz, K. A. Muller, M. Takashige, Europhysics Letters, 3(3), pp. 379-385 (1987).

SUMMARY OF THE INVENTION

This invention relates to novel compositions exhibiting superconductivity at temperatures higher than those obtained in prior known superconductive materials, and to methods for using and forming these compositions. These compositions can carry supercurrents (i.e., electrical currents in a substantially zero resistance state of the composition) at temperatures greater than 26° K. In general, the compositions are characterized as mixed transition metal oxide systems where the transition metal oxide can exhibit multivalent behavior. These compositions have a layer-type crystalline structure, often perovskite-like, and can contain a rare earth or rare earth-like element. A rare earth-like element (sometimes termed a near rare earth element) is one whose properties make it essentially a rare earth element. An example is a group IIIB element of the periodic table, such as La. Substitutions can be found in the rare earth (or rare earth-like) site or in the transition metal sites of the compositions. For example, the rare earth site can also include alkaline earth elements selected from group IIA of the periodic table, or a combination of rare earth or rare earth-like elements and alkaline earth elements. Examples of suitable alkaline earths include Ca, Sr, and Ba. The transition metal site can include a transition metal exhibiting mixed valent behavior, and can include more than one transition metal. A particularly good example of a suitable transition metal is copper. As will be apparent later, Cu-oxide based systems provide unique and excellent properties as high $T_c$ superconductors.

An example of a superconductive composition having high $T_c$ is the composition represented by the formula RE-TM-O, where RE is a rare earth or rare earth-like element, TM is a nonmagnetic transition metal, and O is oxygen. Examples of transition metal elements include Cu, Ni, Cr etc. In particular, transition metals that can exhibit multi-valent states are very suitable. The rare earth elements are typically elements 58-71 of the periodic table, including Ce, Nd, etc. If an alkaline earth element (AE) were also present, the composition would be represented by the general formula RE-AE-TM-O.

The ratio (AE,RE):TM is generally approximately 1:1, but can vary from this as will be shown by examples where the ratio (AE,RE):TM is 2:1. Of course, the amount of oxygen present in the final composition will adjust depending upon the processing conditions and will be such that the valence requirements of the system are satisfied.

The methods by which these superconductive compositions can be made can use known principles of ceramic fabrication, including the mixing of powders containing the rare earth or rare earth-like, alkaline earth, and transition metal elements, coprecipitation of these materials, and heating steps in oxygen or air.

A particularly suitable superconducting material in accordance with this invention is one containing copper as the transition metal. Copper can exist in a $Cu^{2+}$ or $Cu^{3+}$ mixed valence state. The state(s) assumed by copper in the overall composition will depend on the amount of oxygen present and on any substitutions in the crystalline structure. Very high $T_c$ has been found in Cu-oxide systems exhibiting mixed valence states, as indicated by conductivity and other measurements. Copper oxide systems including a rare earth or rare earthlike element, and an alkaline earth element, are unique examples of this general class of superconducting layered copper oxides which exhibit $T_c$ greater than 26° K.

These and other objects, features, and advantages will be apparent from the following more particular description of the preferred embodiments.

DESCRIPTION OF THE PREFERRED EMBODIMENTS

Figure 1:
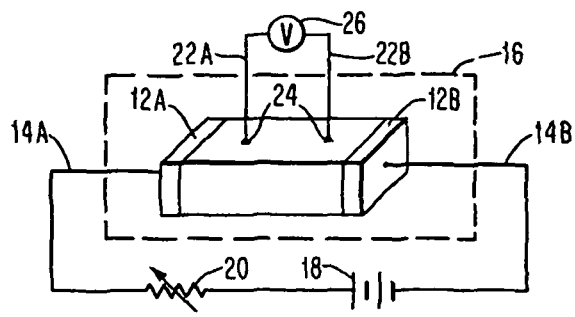
FIG. 1 is a schematic illustration of a representative circuit used to measure dc conductivity in the high $T_c$ superconductors of this invention.

The superconductive compositions of this invention are transition metal oxides generally having a mixed valence and a layer-like crystalline structure, and exhibit $T_c$'s higher than those of previously known superconducting materials. These compositions can also include a rare earth site in the layer-like structure where this site can be occupied by rare earth and rare earth-like atoms, and also by alkaline earth substitutions such as Ca, Sr, and Ba. The amount of oxygen present will be such that the valence requirements of the system are satisfied, the amount of oxygen being somewhat a function of the processing steps used to make the superconductive compositions. Non-stoichiometric amounts of oxygen can be present in these compositions. The valence state of the elements in the oxide will be determined by the final composition in a manner well known to chemists. For example, the transition metal Cu may be present in some compositions in both a $Cu^{2+}$ and a $Cu^{3+}$ state.

An example of a superconductive compound having a layer-type structure in accordance with the present invention is an oxide of the general composition $RE_2TMO_4$, where RE stands for the rare earths (lanthanides) or rare earth-like elements and TM stands for a transition metal. In these compounds the RE portion can be partially substituted by one or more members of the alkaline earth group of elements. In these particular compounds, the oxygen content is at a deficit.

For example, one such compound that meets this general description is lanthanum copper oxide $La_2CuO_4$ in which the lanthanum—which belongs to the IIIB group of elements—is in part substituted by one member of the neighboring IIA group of elements, viz. by one of the alkaline earth metals (or by a combination of the members of the IIA group), e.g., by barium. Also, the oxygen content of the compound can be incomplete such that the compound will have the general composition $La_{2-x}Ba_xCuO_{4-y}$, wherein x≤0.3 and y<0.5.

Another example of a compound meeting this general formula is lanthanum nickel oxide wherein the lanthanum is partially substituted by strontium, yielding the general formula $La_{2-x}Sr_xNiO_{4-y}$. Still another example is cerium nickel oxide wherein the cerium is partially substituted by calcium, resulting in $Ce_{2-x}Ca_xNiO_{4-y}$.

The following description will mainly refer to barium as a partial replacement for lanthanum in a $La_2CuO_4$ compound because it is in the Ba—La—Cu—O system that many laboratory tests have been conducted. Some compounds of the general Ba—La—Cu—O system have been described by C. Michel and B. Raveau in Rev. Chim. Min. 21 (1984) 407, and by C. Michel, L. Er-Rakho and B. Raveau in Mat. Res. Bull., Vol. 20, (1985) 667-671. They did not, however, find or try to find superconductivity. These references and their teachings regarding perovskite-like layered oxides of mixed valent transition metals, and their preparation, are herein incorporated by reference.

Experiments conducted in connection with the present invention have revealed that high-$T_c$ superconductivity is present in compounds where the rare earth or rare earth-like element is partially replaced by any one or more of the members of the IIA group of elements, i.e., the alkaline earth metals. Actually, the $T_c$ of $La_2CuO_{4-y}$ with the substitution $Sr^{2+}$ is higher and its superconductivity-induced diamagnetism larger than that found with the substitutions $Ba^{2+}$ and $Ca^{2+}$.

The Ba—La—Cu—O system can exhibit a number of crystallographic phases, namely with mixed-valent copper constituents which have itinerant electronic states between non-Jahn-Teller $Cu^{3+}$ and Jahn-Teller $Cu^{2+}$ ions.

This applies likewise to systems where nickel is used in place of copper, with $Ni^{3+}$ being the Jahn-Teller constituent, and $Ni^{2+}$ being the non-Jahn-Teller constituent. The existence of Jahn-Teller polarons in conducting crystals was postulated theoretically by K. H. Hoeck, H. Nickisch and H. Thomas in Helv. Phys. Acta 56% (1983) 237. Polarons have large electron-phonon interactions and, therefore, are favorable to the occurrence of superconductivity at higher critical temperatures.

Samples in the Ba—La—Cu—O system, when subjected to X-ray analysis, revealed three individual crystallographic phases, viz.

a first layer-type perovskite-like phase, related to the $K_2NiF_4$ structure, with the general composition $La_{2-x}Ba_xCuO_{4-y}$, with x<<1 and y≥0;

a second, non-conducting CuO phase; and a third, nearly cubic perovskite phase of the general composition $La_{1-x}Ba_xCuO_{3-y}$ which appears to be independent of the exact starting composition. Of these three phases the first one appeared to be responsible for the observed high-$T_c$ superconductivity, the critical temperature showing a dependence on the barium concentration in that phase. Obviously, the $Ba^{2+}$ substitution caused a mixed-valent state of $Cu^{2+}$ and $Cu^{3+}$ to preserve charge neutrality. It is assumed that the oxygen deficiency, y, is the same in the doped and undoped crystallites.

In this application, the terms transition metal oxide, copper oxide, Cu-oxide, etc. are meant to broadly include the oxides which exhibit superconductivity at temperatures greater than 26° K. Thus, the term copper oxide can mean, among other things, an oxide such as $CuO_{4-y}$ in the mixed oxide composition $La_{2-x}Ba_xCuO_{4-y}$.

Both $La_2CuO_4$ and $LaCuO_3$ are metallic conductors at high temperatures in the absence of barium. Actually, both are metals like $LaNiO_3$. Despite their metallic character, the Ba—La—Cu—O type materials are essentially ceramics, as are the other compounds of the $RE_2TMO_4$. type and their manufacture generally follows the known principles of ceramic fabrication. The preparation of a superconductive Ba—La—Cu—O compound, for example, in accordance with the present invention typically involves the following manufacturing steps:

Preparing aqueous solutions of the respective nitrates of barium, lanthanum and copper and coprecipitation thereof in their appropriate ratios, adding the coprecipitate to oxalic acid and forming an intimate mixture of the respective oxalates.

decomposing the precipitate and causing a solid-state reaction by heating the precipitate to a temperature between 500 and 1200° C. for one to eight hours.

pressing the resulting product at a pressure of about 4 kbar to form pellets.

re-heating the pellets to a temperature between 500 and 900° C. for one half hour to three hours for sintering.

It will be evident to those skilled in the art that if the partial substitution of lanthanum by another alkaline earth element, such as strontium or calcium, is desired, the particular nitrate thereof will have to be used in place of the barium nitrate of the example process described above. Also, if the copper of this example is to be replaced by another transition metal, the nitrate thereof will obviously have to be employed. Other precursors of metal oxides, such as carbonates or hydroxides, can be chosen in accordance with known principles.

Experiments have shown that the partial contents of the individual compounds in the starting composition play an important role in the formation of the phases present in the final product. While, as mentioned above, the final Ba—La—Cu—O system obtained generally contains the said three phases, with the second phase being present only in a very small amount, the partial substitution of lanthanum by strontium or calcium (and perhaps beryllium) will result in only one phase existing in the final $La_{2-x}Sr_xCuO_{4-y}$ or $La_{2-x}Ca_x$-$CuO_{4-y}$, respectively, provided x<0.3.

With a ratio of 1:1 for the respective (Ba, La) and Cu contents, it is expected that the three phases will occur in the final product. Setting aside the second phase, i.e. the CuO phase whose amount is negligible, the relative volume amounts of the other two phases are dependent on the barium content in the $La_{2-x}Ba_xCuO_{4-y}$ complex. At the 1:1 ratio and with an x=0.02, the onset of a localization transition is observed, i.e., the resistivity increases with decreasing temperature, and there is no superconductivity.

With x=0.1 at the same 1:1 starting ratio, there is a resistivity drop at the very high critical temperature of 35° K.

With a (Ba, La) versus Cu ratio of 2:1 in the starting composition, the composition of the $La_2CuO_4$:Ba phase, which appears to be responsible for the superconductivity, is imitated, with the result that now only two phases are present, the CuO phase not existing. With a barium content of x=0.15, the resistivity drop occurs at $T_c$=26° K.

The method for preparing these Ba—La—Cu—O sample complexes used two heat treatments for the precipitate at an elevated temperature for several hours. In the experiments carried out in connection with the present invention it was found that best results were obtained at 900° C. for a decomposition and reaction period of 5 hours, and again at 900° C. for a sintering period of one hour. These values apply to a 1:1 ratio composition as well as to a 2:1 ratio composition.

For the 2:1 ratio composition, a somewhat higher temperature is permissible owing to the higher melting point of the composition in the absence of excess copper oxide. However, a one-phase compound was not achieved by a high temperature treatment.

Conductivity Measurements (FIGS. 1-4)

The dc conductivity of representative Ba—La—Cu—O compositions was measured to determine their low temperature behavior and to observe their high $T_c$. These measurements were performed using the well known four-point probe technique, which is schematically illustrated in FIG. 1. Rectangular shaped samples 10 of $Ba_x/La_{5-x}/Cu_5O_{5(3-y)}$ were cut from sintered pellets, and provided with gold sputtered electrodes 12A and 12B, about 0.5 microns thick. Indium wires 14A and 14B contact electrodes 12A and 12B, respectively.

The sample was contained in a continuous flow cryostat 16 (Leybold-Hereaus) and measurements were made over a temperature range 300-4.2° K.

Electrodes 12A and 12B are connected in a circuit including a current source 18 and a variable resistor 20. Indium leads 22A and 22B are pressed into contact with sample 10 and fixed with silver paint 24. Leads 22A, 22B are connected to a voltage reading instrument 26. Since the current and voltage are accurately determined, the resistivity of the sample 10 is then known. In the configuration used for these measurements, a computer was used to provide a computer-controlled fully-automatic system for temperature variation, data acquisition and processing.

Figure 2:
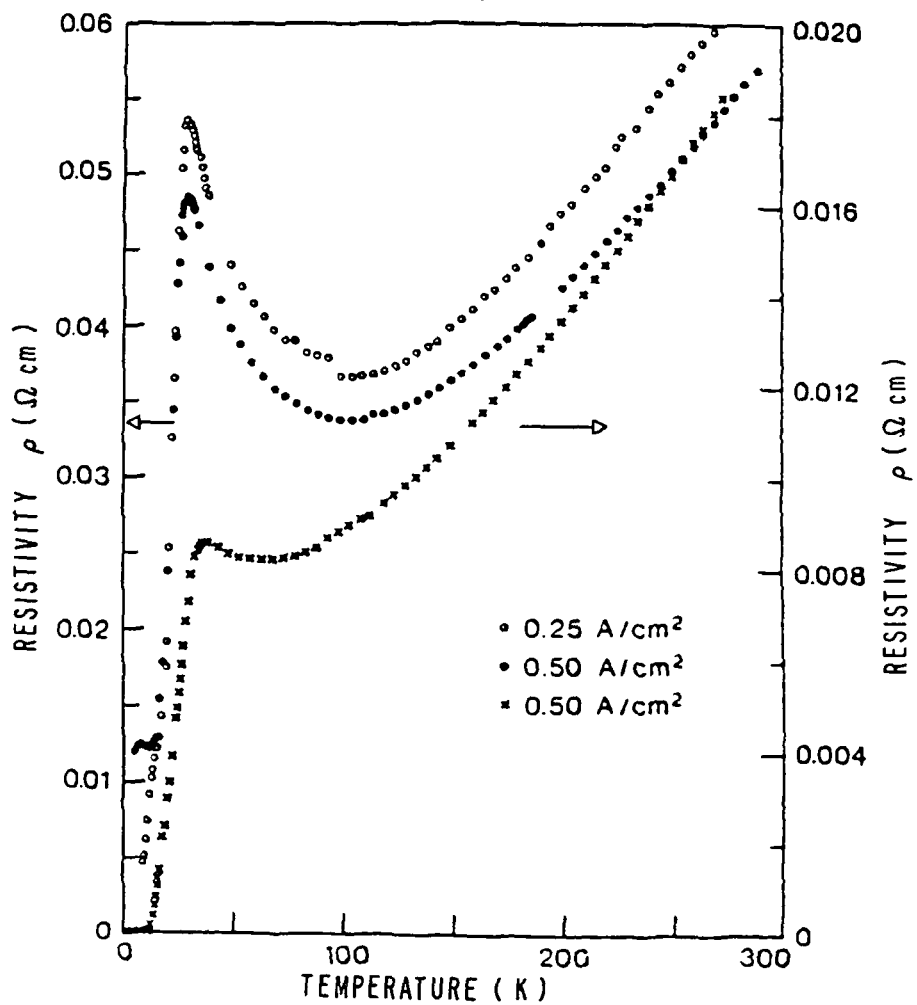
FIG. 2 is a plot of the temperature dependence and resistivity in the composition $Ba_xLa_{5-x}Cu_5O_{5(3-y)}$ for samples with x(Ba)=1 (upper two curves, left scale) and x(Ba)=0.75 (lower curve, right scale). The influence of current density through the composition is also shown.

In FIG. 2, the low temperature dependence of resistivity (P, measured in ohm-cms) in the composition $Ba_xLa_{5-x}Cu_5O_{5(3-y)}$ is plotted for two different values of x. For the upper two curves, the value of x(Ba) is 1 and the left side vertical scale is used. For the lower curve, the value of x is 0.75, and the resistivity scale on the right hand side of the figure is used. The data is taken for different values of current density: 0.25 $A/cm^2$ for the top curve and 0.50 $A/cm^2$ for the middle and bottom curves.

Figure 3:
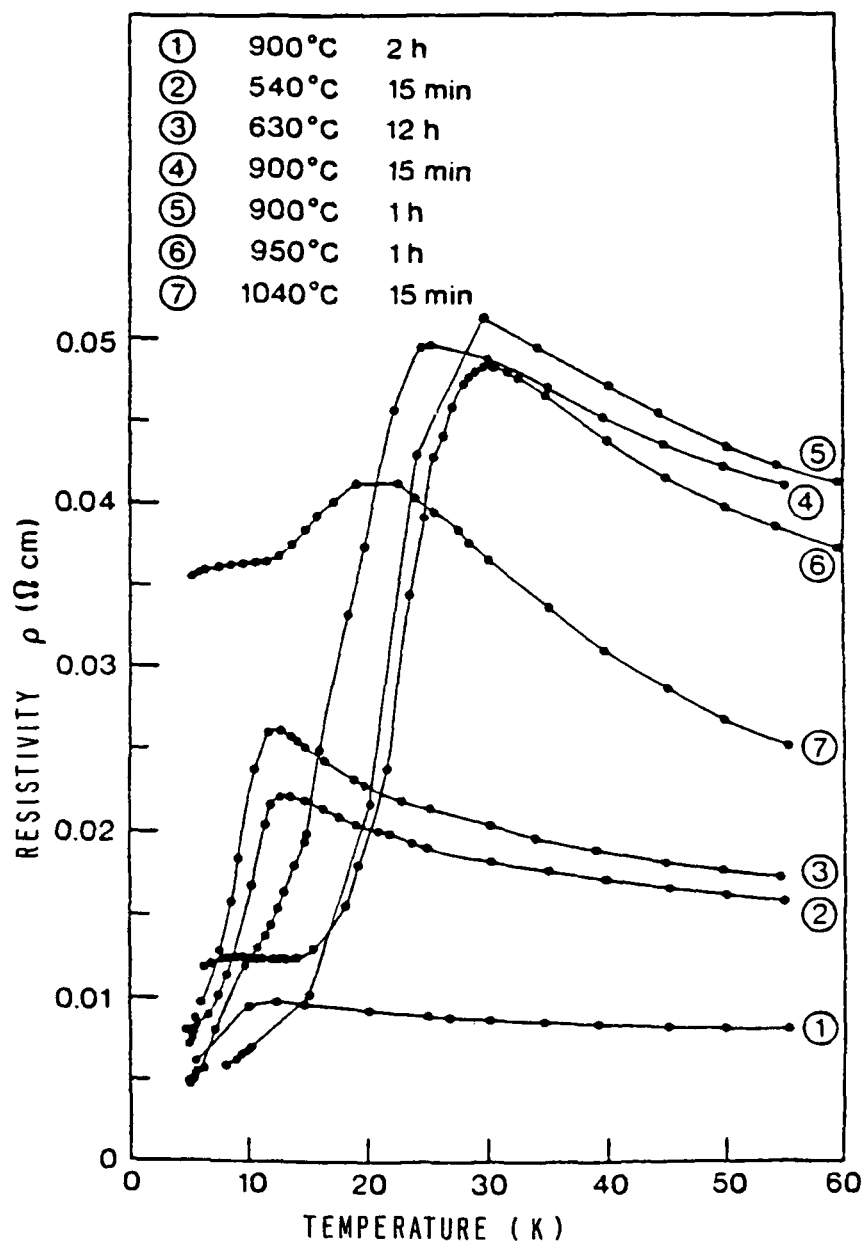
FIG. 3 is a plot of the low temperature dependence of resistivity in the composition $Ba_xLa_{5-x}Cu_5O_{5(3-y)}$ with x(Ba))=1, for different annealing conditions (i.e., temperature and oxygen partial pressure.

For barium-doped samples with x(Ba)<1.0, for example with x<0.3, at current densities of 0.5 $A/cm^2$, a high-temperature metallic behavior with an increase in resistivity at low temperatures was found as depicted in FIG. 2. At still lower temperatures, a sharp drop in resistivity (>90%) occurred which for higher current densities became partially suppressed (FIG. 1 upper curves, left scale). This characteristic drop was studied as a function of the annealing conditions, i.e. temperature and oxygen partial pressure as shown in FIG. 3. For samples annealed in air, the transition from itinerant to localized behavior, as indicated by the minimum in resistivity in the 80° K range, was not found to be very pronounced. Annealing in a slightly reducing atmosphere, however, led to an increase in resistivity and a more pronounced localization effect. At the same time, the onset of the resistivity drop was shifted towards the 30° K region. Curves 4 and 5 (FIG. 3), recorded for samples treated at 900° C., show the occurrence of a shoulder at still lower temperatures, more pronounced in curve 6. At annealing temperatures of 1040° C., the highly conducting phase has almost vanished. Long annealing times and/or high temperatures will generally destroy the superconductivity.

Figure 4:
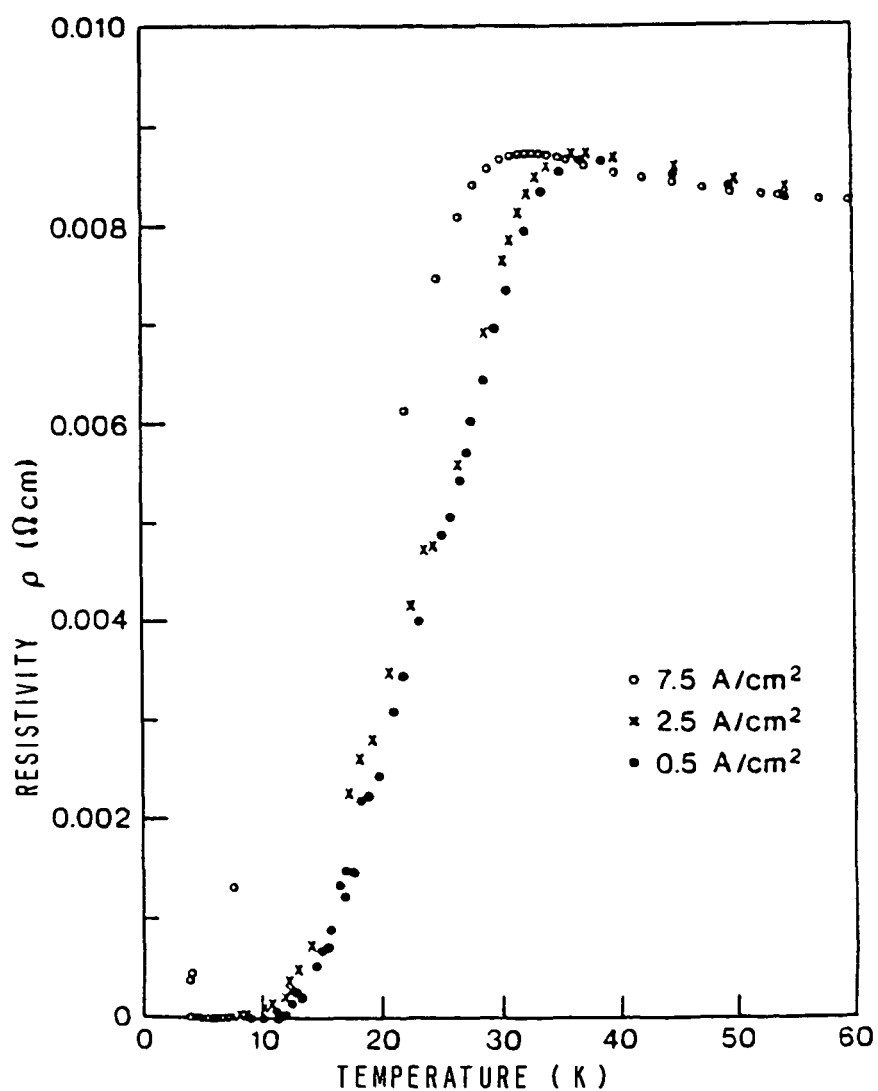
FIG. 4 is a plot of the low-temperature resistivity of the composition $Ba_xLa_{5-x}Cu_5O_{5(3-y)}$ with x(Ba)=0.75, recorded for different densities of electrical current through the composition.

The mixed-valent state of copper is of importance for electron-phonon coupling. Therefore, the concentration of electrons was varied by the Ba/La ratio. A typical curve for a sample with a lower Ba concentration of 0.75 is shown in FIG. 2 (right scale). Its resistivity decreases by at least three orders of magnitude, giving evidence for the bulk being superconducting below 13° K with an onset around 35° K, as shown in FIG. 4 on an expanded temperature scale. FIG. 4 also shows the influence of the current density, typical for granular compounds. Current densities of 7.5, 2.5, and 0.5 $A/cm^2$ were passed through the superconducting composition.

When cooling the samples from room temperature, the resistivity data first show a metal-like decrease. At low temperatures, a change to an increase occurs in the case of Ca substituted compounds and for the Ba-substituted samples. This increase is followed by a resistivity drop, showing the onset of superconductivity at 22±2° K and 33±2° K for the Ca and Ba compounds, respectively. In the Sr compound, the resistivity remains metallic down to the resistivity drop at 40±1° K. The presence of localization effects, however, depends strongly on alkaline-earth ion concentration and sample preparation, that is to say, on annealing conditions and also on the density, which have to be optimized. All samples with low concentrations of Ca, Sr, and Ba show a strong tendency to localization before the resistivity drops occur.

Apparently, the onset of the superconductivity, i.e. the value of the critical temperature $T_c$, is dependent on, among other parameters, the oxygen content of the final compound. It seems that for certain materials, an oxygen deficiency is necessary for the material to have a high-$T_c$ behavior. In accordance with the present invention, the method described above for making the $La_2CuO_4$:Ba complex is complemented by an annealing step during which the oxygen content of the final product can be adjusted. Of course, what was said in connection with the formation of the $La_2CuO_4$:Ba compound likewise applies to other compounds of the general formula $RE_2TMO_4$:AE (where AE is an alkaline earth element), such as, e.g. $Nd_2NiO_4$:Sr.

In the cases where a heat treatment for decomposition and reaction and/or for sintering was performed at a relatively low temperature, i.e., at no more than 950° C., the final product is subjected to an annealing step at about 900° C. for about one hour in a reducing atmosphere. It is assumed that the net effect of this annealing step is a removal of oxygen atoms from certain locations in the matrix of the $RE_2TMO_4$ complex, thus creating a distortion in its crystalline structure. The $O_2$ partial pressure for annealing in this case may be between $10^{-1}$ and $10^{-5}$ bar.

In those cases where a relatively high temperature (i.e., above 950° C.) is employed for the heat treatment, it might be advantageous to perform the annealing step in a slightly oxidizing atmosphere. This would make up for an assumed exaggerated removal of oxygen atoms from the system owing to the high temperature and resulting in a too severe distortion of the system's crystalline structure.

Resistivity and susceptibility measurements as a function of temperature of $Sr^{2+}$ and $Ca^{2+}$-doped $La_2CuO_{4-y}$ ceramics show the same general tendency as the $Ba^{2+}$-doped samples: a drop in resistivity $\rho$ (T), and a crossover to diamagnetism at a slightly lower temperature. The samples containing $Sr^{2+}$ actually yielded a higher onset than those containing $Ba^{2+}$ and $Ca^{2+}$. Furthermore, the diamagnetic susceptibility is about three times as large as for the Ba samples. As the ionic radius of $Sr^{2+}$ nearly matches that of $La^{3+}$, it seems that the size effect does not cause the occurrence of superconductivity. On the contrary, it is rather adverse, as the data on $Ba^{2+}$ and $Ca^{2+}$ indicate.

The highest $T_c$ for each of the dopant ions investigated occurred for those concentrations where, at room temperature, the $RE_{2-x}TM_xO_{4-y}$ structure is close to the orthorhombic-tetragonal structural phase transition, which may be related to the substantial electron-phonon interaction enhanced by the substitution. The alkaline-earth substitution of the rare earth metal is clearly important, and quite likely creates TM ions with no $e_g$ Jahn-Teller orbitals. Therefore, the absence of these Jahn-Teller orbitals, that is, Jahn-Teller holes near the Fermi energy, probably plays an important role in the $T_c$ enhancement.

While examples have been given using different transition metal elements in the superconducting compositions, copper oxide compositions having mixed valence appear to be unique and of particular importance, having superconducting properties at temperatures in excess of 26° K. These mixed valent copper compositions can include a rare earth element and/or a rare earth-like element which can be substituted for by an alkaline earth element. The amount of oxygen in these compositions will vary depending upon the mode of preparation and will be such as to meet the valence requirements of the composition. These copper-based compositions have a layer-like structure, often of a perovskite type. For a more detailed description of some of the types of crystallographic structures that may result, reference is made to the aforementioned publication by Michel and Raveau in Rev. Chim. Min. 21, 407 (1984), and to C. Michel et al, Mat. Res. Bull., Vol. 20, 667-671 (1985).

While the invention has been described with respect to particular embodiments thereof, it will be apparent to those of skill in the art that variations can be made therein without departing from the spirit and scope of the present invention. For example, while the range of compositions includes rare earth elements and transition metal elements, the ratios of these elements can be varied because the crystalline structure can accommodate vacancies of these elements and still retain a layer-like structural phase exhibiting superconductivity.

Further, the stoichiometry or degree of non-stoichiometry of oxygen content (i.e., oxygen deficit or surplus) of these compositions can be varied by using reducing or oxidizing atmospheres during formation of the compounds and by using different doping amounts in the rare earth and transition metal sites of the crystal structure. This type of distortion of the crystal structure and the many forms that it can encompass are readily apparent from reference to the aforementioned Michel and Raveau publications. Thus, the invention broadly relates to mixed (doped) transition metal oxides having a layer-like structure that exhibit superconducting behavior at temperatures in excess of 26° K. Of these materials, a mixed copper oxide having multivalent states provides high $T_c$ and favorable superconducting properties.

Having thus described our invention what we claim as new and desire to secure as Letters Patent, is:

1. A method comprising: forming a transition metal oxide having a phase therein which exhibits a superconducting state at a critical temperature greater than or equal to 26° K,
    maintaining the temperature of said transition metal oxide at a temperature less than said critical temperature to produce said superconducting state in said phase,
    passing an electrical supercurrent through said transition metal oxide while it is in said superconducting state, and
    said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

2. The method of claim 1, where said transition metal oxide is comprised of a transition metal capable of exhibiting multivalent states.

3. The method of claim 1, where said transition metal oxide is comprised of a Cu oxide.

4. A method, comprising:
    forming a composition including a transition metal, a rare earth or rare earth-like element, an alkaline earth element, and oxygen, where said composition is a mixed transition metal oxide having a non-stoichiometric amount of oxygen therein and exhibiting a superconducting state at a temperature greater than 26° K,
    maintaining said composition in said superconducting state at a temperature greater than or equal to 26° K, and
    passing an electrical current through said composition while said composition is in said superconducting state.

5. The method of claim 4, where said transition metal is copper.

6. A method comprising:
    forming a composition exhibiting a superconductive state at a temperature in excess of 26° K, maintaining said composition at a temperature greater than or equal to 26° K at which temperature said composition exhibits said superconductive state,
    passing an electrical current through said composition while said composition is in said superconductive state, and
    said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

7. The method of claim 6, where said composition is comprised of a copper oxide.

8. The metal of claim 6, where said composition is comprised of a transition metal oxide.

9. A superconductive method for causing electric current flow in a superconductive state at a temperature greater than or equal to 26 K, comprising:
    (a) providing a superconductor element made of a superconductive composition, the superconductive composition comprising a compound having a layer-type perovskite-like crystal structure, the composition having a superconductor transition temperature $T_c$ of greater than 26 K;
    (b) maintaining the superconductor element at a temperature greater than or equal to 26 K and below the superconductor transition temperature $T_c$ of the superconductive composition;
    (c) causing an electric current to flow in the superconductor element and
    (d) said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

10. The superconductive method according to claim 9 in which the compound of the superconductive composition comprises at least one rare-earth or rare-earth-like element and at least one alkaline-earth element.

11. The superconductive method according to claim 10 in which the rare-earth or rare-earth-like element is lanthanum.

12. The superconductive method according to claim 10 in which the alkaline-earth element is barium.

13. The superconductive method according to claim 9 in which the compound of the superconductive composition includes mixed valent transition metal ions.

14. The superconductive method according to claim 13 in which the compound comprises at least one element in a nonstoichiometric atomic proportion.

15. The superconductive method according to claim 14 in which oxygen is present in the compound in a nonstoichiometric atomic proportion.

16. A superconductive method for conducting an electric current essentially without resistive losses, comprising:
    (a) providing a superconductor element made of a superconductive composition, the superconductive composition comprising a layer-type perovskite-like crystal structure, the composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than 26 K;

(b) maintaining the superconductor element at a temperature below the effectively-zero-bulk-resistivity intercept temperature $T_{p=0}$ of the superconductive composition; and (c) causing an electric current to flow in the superconductor element.

17. The superconductive method according to claim 16 in which the rare-earth or rare-earth-like element is lanthanum.

18. The superconductive method according to claim 16 in which the alkaline-earth element is barium.

19. The superconductive method according to claim 16 in which the compound of the superconductive composition includes mixed valent copper ions.

20. The superconductive method according to claim 19 in which compound is a the copper-oxide comprising at least one element in a nonstoichiometric atomic proportion.

21. The superconductive method according to claim 20 in which oxygen is present in the copper-oxide compound in a nonstoichiometric atomic proportion.

22. A method comprising:
forming copper oxide having a phase therein which exhibits a superconducting state at a critical temperature greater than or equal to 26° K;
maintaining the temperature of said material at a temperature less than said critical temperature to produce said superconducting state in said phase;
passing an electrical supercurrent through said copper oxide while it is in said superconducting state;
said copper oxide at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

23. A method comprising:
forming a composition including copper, oxygen and an element selected from the group consisting of a Group II A element, a rare earth element, a rare-earthlike element, an alkaline earth element and a Group III B element, where said composition is a mixed copper oxide having a non-stoichiometric amount of oxygen therein and exhibiting a superconducting state at a temperature greater than or equal to 26° K;
maintaining said composition in said superconducting state at a temperature greater than or equal to 26° K; and
passing an electrical current through said composition while said composition is in said superconducting state.

24. A method comprising:
forming a composition exhibiting a superconductive state at a temperature greater than or equal to 26° K;
maintaining said composition at a temperature greater than or equal to 26° K at which temperature said composition exhibits said superconductive state;
passing an electrical current through said composition while said composition is in said superconductive state; and
said composition including a copper oxide and an element selected from the group consisting of Group II A element, a rare earth element a rare earth like element, an alkaline earth element and a Group III B element.

25. A superconductive method for causing electric-current flow in a superconductive state at a temperature greater than or equal to 26° K, comprising:
(a) providing a superconductor element made of a superconductive composition, the superconductive composition comprising a copper-oxide compound having a layer-type perovskite-like crystal structure, the composition having a superconductive transition temperature $T_c$ of greater than or equal to 26° K, said superconductive composition includes at least one element selected from the group consisting of a Group IIA element, a rare earth element, a rare earth like element; an alkaline earth element, a Group IIA element and a Group III B element;
(b) maintaining the superconductor element at a temperature above 26° K and below the superconductor transition temperature $T_c$ of the superconductive composition; and
(c) causing an electric current to flow in the superconductor element.

26. A superconductive method for conducting an electric current essentially without resistive losses, comprising:
(a) providing a superconductor element made of a superconductive composition, the superconductive composition comprising a copper-oxide compound having a layer-type perovskite-like crystal structure, the copper-oxide compound including at least one element selected from the group consisting of a Group IIA element, a rare earth element, a rare earth like element, an alkaline earth element, a Group IIA element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) maintaining the superconductor element at a temperature below the effectively-zero-bulk-resistivity intercept temperature $T_{p=0}$ of the superconductive composition; and
(c) causing an electric current to flow in the superconductor element.

27. A method comprising:
forming copper oxide having a phase therein which exhibits a superconducting state at a critical temperature greater than or equal to 26° K;
maintaining the temperature of said material at a temperature less than said critical temperature to produce said superconducting state in said phase;
passing an electrical supercurrent through said copper oxide while it is in said superconducting state;
said copper oxide includes at least one element selected from the group consisting of a Group IIA element a rare earth element, a rare earth like element, an alkaline earth element, a Group IIA element and a Group III B element.

28. A method comprising the steps of:
forming a composition including copper, oxygen and an element selected from the group consisting of at least one Group II A element a rare earth element, a rare earth like element, an alkaline earth element and a Group III B element, where said composition is a mixed copper oxide having a non-stoichiometric amount of oxygen therein and exhibiting a superconducting state at a temperature greater than or equal to 26° K;

maintaining said composition in said superconducting state at a temperature greater than 26° K; and passing an electrical current through said composition while said composition is in said superconducting state.

29. A method including the steps of:

forming a composition exhibiting a superconductive state at a temperature greater than or equal to 26° K;

maintaining said composition at a temperature greater than or equal to 26° K at which temperature said composition exhibits said superconductive state;

passing an electrical current through said composition while said composition is in said superconductive state; and said composition including a copper oxide and at least one element selected from the group consisting of Group II A, a rare earth element, a rare earth like element, and an alkaline earth element and a Group III B element.

30. A superconductive method for causing electric-current flow in a superconductive state at a temperature greater than or equal to 26° K, comprising:

(a) providing a superconductor element made of a superconductive composition, the superconductive composition comprising a copper-oxide compound having a layer-type perovskite-like crystal structure, the composition having a superconductive transition temperature $T_c$ of greater than or equal to 26° K, said superconductive composition includes at least one element selected from the group consisting of a Group II A element, a rare earth element, a rare earth like element, and alkaline earth element and a Group III B element;

(b) maintaining the superconductor element at a temperature above 26° K and below the superconductor transition temperature $T_c$ of the superconductive composition; and (c) causing an electric current to flow in the superconductor element.

31. A superconductive method for conducting an electric current essentially without resistive losses, comprising:

(a) providing a superconductor element made of a superconductive composition, the superconductive composition comprises a copper-oxide compound having a layer-type perovskite-like crystal structure, the copper-oxide compound including at least one element selected from the group consisting of a Group II A element, a rare earth element, a rare earth like element, an alkaline earth element and a Group III B element, the composition having a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) maintaining the superconductor element at a temperature below the effectively-zero-bulk-resistivity intercept temperature $T_{p=0}$ of the superconductive composition; and (c) causing an electric current to flow in the superconductor element.

32. A method comprising:

forming a transition metal oxide having a phase therein which exhibits a superconducting state at a critical temperature in excess of 26° K;

maintaining the temperature of said material at a temperature less than said critical temperature to produce said superconducting state in said phase;

passing an electrical superconducting current through said transition metal oxide while it is in said superconducting state;

said transitional metal oxide includes at least one element selected from the group consisting of a Group II A element, a rare earth element, a rare earth like element, an alkaline earth element and a Group III B element.

33. A method comprising:

forming a composition including a transition metal, oxygen and an element selected from the group consisting of at least one Group II A element, a rare earth element, a rare earth like element, an alkaline earth element and a Group III B element, where said composition is a mixed transitional metal oxide formed from said transition metal and said oxygen, said mixed transition metal oxide having a non-stoichiometric amount of oxygen therein and exhibiting a superconducting state at a temperature greater than or equal to 26° K;

maintaining said composition in said superconducting state at a temperature greater than or equal to 26° K; and passing an electrical current through said composition while said composition is in said superconducting state.

34. A method comprising:

forming a composition exhibiting a superconductive state at a temperature or equal to 26° K;

maintaining said composition at a temperature greater than or equal to 26° K at which temperature said composition exhibits said superconductive state;

passing an electrical current through said composition while said composition is in said superconductive state; and said composition including a transitional metal oxide and at least one element selected from the group consisting of Group II A, a rare earth element, a rare earth like element, an alkaline earth element and a Group III B element.

35. A superconductive method for causing electric-current flow in a superconductive state at a temperature in excess of 26° K, comprising:

(a) providing a superconductor element made of a superconductive composition, the superconductive composition comprising a transition metal oxide compound having a layer-type perovskite-like crystal structure, the composition having a superconductive transition temperature $T_c$ of greater than or equal to 26° K, said superconductive composition includes at least one element selected from the group consisting of a Group II A element, a rare earth element, a rare earth like element, an alkaline earth element and a Group III B element;

(b) maintaining the superconductor element at a temperature greater than or equal to 26° K and below the superconductor transition $T_c$ of the superconductive composition; and (c) causing an electric current to flow in the superconductor element.

36. A superconductive method for conducting an electric current essentially without resistive losses, comprising:

(a) providing a superconductor element made of a superconductive composition, the superconductive composition comprising a transition metal-oxide compound having a layer-type perovskite-like crystal structure, the transition metal-oxide compound including at least one element selected from the group consisting of a Group II A element, a rare earth element, a rare earth like element, an alkaline earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) maintaining the superconductor element at a temperature below the effectively-zero-bulk-resistivity intercept temperature $T_{p=0}$ of the superconductive composition; and (c) causing an electric current to flow in the superconductor element.

37. A method comprising:

forming copper oxide having a phase therein which exhibits a superconducting state at a critical temperature greater than or equal to 26° K;

maintaining the temperature of said material at a temperature less than said critical temperature to produce said superconducting state in said phase;

passing an electrical supercurrent through said copper oxide while it is in said superconducting state;

said copper oxide includes at least one element selected from group consisting of a Group II A element, a rare earth element, a rare earth like element, an alkaline earth element and a Group III B element.

38. A method comprising:

forming a composition comprising copper, oxygen and at least one Group II A element, at least one rare earth element or rare earth like element, at least one alkaline earth element and at least one Group III B element, where said composition is a mixed copper oxide having a non-stoichiometric amount of oxygen therein and exhibiting a superconducting state at a temperature greater than or equal to 26° K;

maintaining said composition in said superconducting state at a temperature greater than or equal to 26° K; and passing an electrical current through said composition while said composition is in said superconducting state.

39. A method comprising:

forming a composition exhibiting a superconductive state at a temperature greater than or equal to 26° K;

maintaining said composition at a temperature in greater than of equal to 26° K at which temperature said composition exhibits said superconductive state;

passing an electrical current through said composition while said composition is in said superconductive state; and said composition comprising a copper oxide and at least one element selected from the group consisting of Group II A element, a rare earth element, a rare earth like element, and alkaline earth element and a Group III B element.

40. A superconductive method for causing electric-current flow in a superconductive state at a temperature greater than or equal to 26° K, comprising:

(a) providing a superconductor element made of a superconductive composition, the superconductive composition comprising a copper-oxide compound having a layer-type perovskite-like crystal structure, the composition having a superconductive transition temperature $T_c$ of greater than or equal to 26° K, said superconductive composition includes at least one element selected from the group consisting of a Group II A element, a rare earth element, a rare earth like element and a Group III B element;

(b) maintaining the superconductor element at a temperature greater than or equal to 26° K and below the superconductor transition temperature $T_c$ of the superconductive composition; and (c) causing an electric current to flow in the superconductor element.

41. A superconductive method for conducting an electric current essentially without resistive losses, comprising:

(a) providing a superconductor element made of a superconductive composition, the superconductive composition consisting essentially of a copper-oxide compound having a layer-type perovskite-like crystal structure, the copper-oxide compound comprising at least one Group II A element, at least one a rare earth element or rare earth like element and at least one Group III B element, the composition having a superconductive-resistive transition temperature defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) maintaining the superconductor element at a temperature below the effectively-zero-bulk-resistivity intercept temperature $T_{p=0}$ of the superconductive composition; and (c) causing an electric current to flow in the superconductor element.

42. A method comprising: providing a composition having a transition temperature greater than or equal to 26° K, the composition comprising, a transition metal element capable of exhibiting multivalent states and oxygen, including at least one phase that exhibits superconductivity at temperature greater than or equal to 26° K, maintaining said composition at said temperature to exhibit said superconductivity and passing an electrical superconducting current through said composition with said phrase exhibiting said superconductivity and said superconducting transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

43. A method according to claim 42 wherein said composition comprises a substantially layered perovskite crystal structure.

44. A method comprising: providing a superconducting transition metal oxide having a superconductive onset temperature greater than or equal to 26° K, maintaining said superconducting transition metal oxide at a temperature less than said superconducting onset temperature, flowing a superconducting current therein and said superconducting transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

45. A method according to claim 44 wherein said superconducting transistor metal oxide comprises a substantially layered perovskite crystal structure.

46. A method comprising: providing a superconducting copper oxide having a superconductive onset temperature greater than or equal to 26° K, maintaining said superconducting copper oxide at a temperature less than said superconducting onset temperature and flowing a superconducting current in said superconducting copper oxide and said superconducting copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

47. A method according to claim 46 wherein said superconducting copper oxide comprises a substantially layered perovskite crystal structure.

48. A method comprising: providing a superconducting oxide composition having a superconductive onset temperature greater than or equal to 26° K, maintaining said superconducting copper oxide at a temperature less than said superconducting onset temperature and flowing a superconducting current therein, said superconducting oxide composition comprising at least one each of rare earth element or rare earth like, an alkaline earth element, and copper.

49. A method according to claim 48 wherein said superconducting oxide composition comprises a substantially layered perovskite crystal structure.

50. A method comprising: providing a superconducting copper oxide composition having a superconductive onset temperature greater than or equal to 26° K, maintaining said superconducting copper oxide at a temperature less than said superconducting onset temperature and flowing a superconducting electrical current therein, said composition comprising at least one each of a Group III B element, an alkaline earth, and copper.

51. A method according to claim 50 wherein said superconducting oxide composition comprises a substantially layered perovskite crystal structure.

52. A method comprising: flowing a superconducting electrical current in a transition metal oxide having a $T_c$ greater than or equal to 26° K, maintaining said transition metal oxide at a temperature less than said $T_c$ and said transition metal oxide comprises at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

53. A method according to claim 52 wherein said transistor metal oxide comprises a substantially layered perovskite crystal structure.

54. A method comprising: flowing a superconducting current in a copper oxide having a $T_c$ greater than or equal to 26° K and maintaining said copper oxide at a temperature less than said $T_c$ and said superconducting copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

55. A method according to claim 54 wherein said copper oxide comprises a substantially layered perovskite crystal structure.

56. A method comprising the steps of:
forming a composition of the formula $Ba_xLa_{x-5}$, $Cu_5O_y$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K;
maintaining the temperature of said composition at a temperature less than said critical temperature to induce said superconducting state in said metal oxide phase; and
passing an electrical current through said composition while said metal oxide phase is in said superconducting state.

57. A method according to claim 56 wherein said composition comprises a substantially layered perovskite crystal structure.

58. A method comprising flowing a superconducting electrical current in a composition of matter having a $T_c$ greater than or equal to 26° K, said composition comprising at least one each of a III B element, an alkaline earth, and copper oxide and maintaining said composition of matter at a temperature less than or equal to said $T_c$.

59. A method according to claim 58 wherein said composition of matter comprises a substantially layered perovskite crystal structure.

60. A method comprising flowing a superconducting electrical current in a composition of matter having a $T_c$ greater than or equal to 26° K, said composition comprising at least one each of a rare earth, alkaline earth, and copper oxide and maintaining said composition of matter at a temperature less than said $T_c$.

61. A method according to claim 60 wherein said composition of matter comprises substantially layered perovskite crystal structure.

62. A method comprising: flowing a superconducting electrical current in a composition of matter having a $T_c$ greater than or equal to 26° K, said composition comprising at least one each of a rare earth element or rare earth like element, and copper oxide and maintaining said composition of matter at a temperature less than said $T_c$.

63. A method according to claim 62 wherein said composition of matter comprises a substantially layered perovskite crystal structure.

64. A method comprising: flowing a superconducting electrical current in a composition of matter having a $T_c$ greater than or equal to 26° K carrying, said composition comprising at least one each of a III B element, and copper oxide and maintaining said composition of matter at a temperature less than said $T_c$.

65. A method according to claim 64 wherein said composition of matter comprises substantially layered perovskite crystal structure.

66. A method comprising: flowing a superconducting electrical current in a transition metal oxide comprising a $T_c$ greater than or equal to 26° K, maintaining said transition metal oxide at a temperature less than said said $T_c$ and said transition metal oxide comprises at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

67. A method according to claim 66 wherein said transistor metal oxide comprises substantially layered perovskite crystal structure.

68. A method comprising: flowing a superconducting electrical current in a copper oxide composition of matter comprising a $T_c$ greater than or equal to 26° K, maintaining said copper oxide composition of matter at a temperature less than said $T_c$ and said copper oxide composition comprises at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

69. A method according to claim 68 wherein said copper oxide composition comprises substantially layered perovskite crystal structure.

70. A method, comprising:
forming a composition comprising a transition metal, a group IIIB element, an alkaline earth element, and oxygen, where said composition is a mixed transition metal oxide having a non-stoichiometric amount of oxygen therein and exhibiting a superconducting state at a temperature greater than or equal to 26° K,
maintaining said composition in said superconducting state at a temperature greater than 26° K, and
passing an electrical current through said composition while said composition is in said superconducting state.

71. The method of claim 70, where said transition metal is copper.

72. A superconductive method for causing electric current flow in a superconductive state at a temperature greater than or equal to 26 K, comprising:
(a) providing a superconductor element made of a superconductive composition, the superconductive composition consisting essentially of a copper-oxide compound having a substantially layered perovskite crystal structure, the composition having a superconductor transition temperature $T_c$ of greater than or equal to 26 K and comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements;
b) maintaining the superconductor element at a temperature above 26 K and below the superconductor transition temperature $T_c$ of the superconductive composition; and
(c) causing an electric current to flow in the superconductor element.

73. The superconductive method according to claim 72 in which the copper-oxide compound of the superconductive composition includes mixed valent copper ions.

74. The superconductive method according to claim 73 in which the copper-oxide compound includes at least one element in a nonstoichiometric atomic proportion.

75. The superconductive method according to claim 74 in which oxygen is present in the copper-oxide compound in a nonstoichiometric atomic proportion.

76. A superconductive method for causing electric current flow in a superconductive state at a temperature greater than or equal to 26 K, comprising:
(a) providing a superconductor element made of a superconductive composition, the superconductive composition consisting essentially of a copper-oxide compound having a substantially layered perovskite crystal structure, the composition having a superconductor transition temperature $T_c$ of greater than or equal to 26 K;
b) maintaining the superconductor element at a temperature above 26 K and below the superconductor transition temperature $T_c$ of the superconductive composition; and
(c) causing an electric current to flow in the superconductor element
(d) the copper-oxide compound of the superconductive composition includes at least one element selected from the group consisting of a rare-earth element or rare earth like element and a Group III B element and at least one alkaline-earth element.

77. The superconductive method according to claim 76 in which the rare-earth or rare-earth-like element is lanthanum.

78. The superconductive method according to claim 76 in which the alkaline-earth element is barium.

79. A superconductive method for conducting an electric current essentially without resistive losses, comprising:
(a) providing a superconductor element made of a superconductive composition, the superconductive composition consisting essentially of a copper-oxide compound having a substantially layered perovskite crystal structure, the copper-oxide compound including at least one element selected from the group consisting of a rare-earth element or a rare earth like element and a Group III B element and at least one alkaline-earth element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26 K;
(b) maintaining the superconductor element at a temperature below the effectively-zero-bulk-resistivity intercept temperature $T_{p=0}$ of the superconductive composition; and
(c) causing an electric current to flow in the superconductor element.

80. The superconductive method according to claim 79 in which said at least one element is lanthanum.

81. The superconductive method according to claim 79 in which the alkaline-earth element is barium.

82. The superconductive method according to claim 79 in which the copper-oxide compound of the superconductive composition includes mixed valent copper ions.

83. The superconductive method according to claim 82 in which the copper-oxide compound includes at least one element in a nonstoichiometric atomic proportion.

84. The superconductive method according to claim 83 in which oxygen is present in the copper-oxide compound in a nonstoichiometric atomic proportion.

85. A superconductive method for causing electric-current flow in a superconductive state at a temperature greater than or equal to 26° K, comprising:
(a) providing a superconductor element made of a superconductive composition, the superconductive composition consisting essentially of a copper-oxide compound having a substantially layered perovskite crystal structure, the composition having a superconductive transition temperature $T_c$ of greater than or equal to 26° K, said superconductive composition includes at least one element selected from the group consisting of a Group II A element, a rare earth element, a rare earth like element, an alkaline earth element and a Group III B element;
(b) maintaining the superconductor element at a temperature above 26° K and below the superconductor transition temperature $T_c$ of the superconductive composition; and
(c) causing an electric current to flow in the superconductor element.

86. A superconductive method for conducting an electric current essentially without resistive losses, comprising:
(a) providing a superconductor element made of a superconductive composition, the superconductive composition comprising a copper-oxide compound having a substantially layered perovskite crystal structure, the copper-oxide compound including at least one element selected from the group consisting of a Group II A element, a rare earth element, a rare earth like element, an alkaline earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) maintaining the superconductor element at a temperature below the effectively-zero-bulk-resistivity intercept temperature $T_{p=0}$ of the superconductive composition; and (c) causing an electric current to flow in the superconductor element.

87. A superconductive method for causing electric-current flow in a superconductive state at a temperature greater than or equal to 26° K, comprising:

(a) providing a superconductor element made of a superconductive composition, the superconductive composition consisting essentially of a copper-oxide compound having a substantially layered perovskite crystal structure, the composition having a superconductive transition temperature $T_c$ of greater than or equal to 26° K, said superconductive composition includes at least one Group II A element and at least one element selected from the group consisting of a rare earth element, a rare earth like element and a Group III B element;

(b) maintaining the superconductor element at a temperature above 26° K and below the superconductor transition temperature $T_c$ of the superconductive composition; and (c) causing an electric current to flow in the superconductor element.

88. A superconductive method for conducting an electric current essentially without resistive losses, comprising:

(a) providing a superconductor element made of a superconductive composition, the superconductive composition consisting essentially of a copper-oxide compound having a substantially layered perovskite crystal structure, the copper-oxide compound including at least one element selected from the group consisting of a Group II A element and at least one element selected from the group consisting of a rare earth element or a rare earth like element and a Group III B element, the composition having a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) maintaining the superconductor element at a temperature below the effectively-zero-bulk-resistivity intercept temperature $T_{p=0}$ of the superconductive composition; and (c) causing an electric current to flow in the superconductor element.

89. A superconductive method for causing electric-current flow in a superconductive state at a temperature in excess of 26° K, comprising:

(a) providing a superconductor element made of a superconductive composition, the superconductive composition consisting essentially of a transition metal oxide compound having a substantially layered perovskite crystal structure, the composition having a superconductive transition temperature $T_c$ of greater than or equal to 26° K, said superconductive composition includes at least one element selected from the group consisting of a Group II A element, a rare earth element, a rare earth like element, an alkaline earth element and a Group III B element;

(b) maintaining the superconductor element at a temperature above 26° K and below the superconductor transition $T_c$ of the superconductive composition; and (c) causing an electric current to flow in the superconductor element.

90. A superconductive method for conducting an electric current essentially without resistive losses, comprising:

(a) providing a superconductor element made of a superconductive composition, the superconductive composition consisting essentially of a transition metal-oxide compound having a substantially layered perovskite crystal structure, the transition metal-oxide compound including at least one element selected from each of Group II A element, a rare earth element or rare earth like element, an alkaline earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) maintaining the superconductor element at a temperature below the effectively-zero-bulk-resistivity intercept temperature $T_{p=0}$ of the superconductive composition; and (c) causing an electric current to flow in the superconductor element.

91. An method comprising:

providing a composition comprising a transition metal, oxygen and any element selected from the group consisting of a Group II A element, a rare earth element or a rare earth like element and a Group III B element, where said composition is a mixed transition metal oxide having a non-stoichiometric amount of oxygen therein and exhibiting a superconducting state at a temperature greater than or equal to 26° K;

maintaining said composition in said superconducting state at a temperature greater than or equal to 26° K; and passing an electrical current through said composition while said composition is in said superconducting state.

92. A method according to claim 91 wherein said transition metal is copper.

93. An method comprising:

providing a composition comprising a transition metal, oxygen and (1) a rare earth element or a rare earth-like element or a group III B element, and/or (2) an alkaline earth element or a Group IIA element, where said composition exhibits a superconducting state at a temperature greater than or equal to 26° K;

maintaining said composition in said superconducting state at a temperature greater than or equal to 26° K; and passing an electrical current through said composition while said composition is in said superconducting state.

94. A method according to claim 93 wherein said transition metal is copper.

95. A method comprising:

flowing a superconducting current through a material comprising a $T_c$ greater than or equal to 26° K, said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

96. A method according to claim 95 further including maintaining said material at a temperature less than or equal to said $T_c$ and greater than or equal to 26° K.

97. A method according to claim 96 further including providing a source of current for said superconducting current.

98. A method according to claim 97 wherein said material is maintained at a temperature less than equal to said $T_c$ and greater than or equal to 26° K.

99. A method according to claim 98 said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

100. A method according to claim 97 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth,
rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

101. A method according to claim 96 wherein said material is maintained at a temperature less than or equal to said $T_c$ and greater than or equal to 26° K.

102. A method according to claim 101 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

103. A method according to claim 96 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is
a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting, a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

104. A method according to claim 95 further including providing a source of current for said superconducting current.

105. A method according to claim 104 wherein said material is maintained at a temperature less than or equal to said $T_c$ and greater than or equal to 26° K.

106. A method according to claim 105 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

107. A method according to claim 104 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

108. A method according to claim 95 wherein said material is maintained at a temperature less than or equal to said $T_c$ and greater than or equal to 26° K.

109. A structure according to claim 108 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

110. A method according to claim 95 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

111. A method according to claim 95, wherein said transition metal is selected from the group consisting of copper, nickel and chromium.

112. A method according to claim 95 wherein said rare earth-like elements include elements comprising property which makes it essentially a rare earth element.

113. A method according to claim 95 wherein said composition comprises one or more of Be, Mg, Ca, Sr, Ba, Ra, Sc, Y, La, Ce, Pr, Nd, Pm, Sm, Eu, Gd, Tb, Dy, Ho, Er, Tm, Yb and Lu.

114. A method according to claim 95 wherein said composition comprises one or more of one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

115. A method according to claim 95 wherein said material can be made according to known principles of ceramic science.

116. A method according to claim 95 wherein said material comprises a metallic, oxygen-deficient, perovskite-like, mixed valent transition metal compound.

117. A method according to claim 95 wherein said material comprises a metallic, oxygen-deficient, perovskite-like, mixed valent copper compound.

118. A method according to claim 95 wherein said material comprises a multiphase material wherein at least one phase exhibits superconductivity.

119. A method according to claim 95 wherein said method is a method of operation of a structure capable of magnetic levitation.

120. A method according to claim 95 wherein said material comprises at least one element selected from each of said first element group and said second element group.

121. A method according to claim 95 where in said superconducting current is flowing in a structure selected from the group consisting of a device, an apparatus, a circuit and a combination.

122. A method according to claim 121 wherein said material possesses substantially zero electrical resistance.

123. A method according to claim 122 wherein said material possesses substantially zero electrical resistance.

124. A method according claim 121 wherein said material is part of a circuit element, said circuit element is designed for said circuit element to be carrying said superconducting current.

125. A method according to claim 124 wherein said material possesses substantially zero electrical resistance.

126. A method according to claim 121 further including forming said material.

127. A method according to claim 121 further including providing said material.

128. A method comprising:

flowing a superconducting current through a material having a $T_c$ greater than or equal to 26° K said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

129. A method comprising:

flowing a superconducting current through a material with a $T_c$ greater than or equal to 26° K said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and group IIA elements.

130. A method comprising:

flowing a superconducting current through a material possessing a $T_c$ greater than or equal to 26° K;

said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

131. An method comprising:
maintaining a composition in a superconducting state at a temperature greater than or equal to 26° K;
said composition possesses an electrical current passing through said composition while said composition is in said superconducting state; and
said composition comprising a transition metal, oxygen and any element selected from the group consisting of a Group II A element, a rare earth element and a Group III B element, where said composition is a mixed copper oxide having a non-stoichiometric amount of oxygen therein and exhibiting a superconducting state at a temperature greater than or equal to 26° K.

132. A method according to claim 131 wherein said transition metal is copper.

133. An method comprising:
maintaining a composition in a superconducting state at a temperature greater than or equal to 26° K;
said composition possesses an electrical current passing through said composition while said composition is in said superconducting state; and
said composition comprising a transition metal, oxygen and (1) a rare earth element or a rare earth-like element or a group III B element, and/or (2) an alkaline earth element or a Group IIA element, where said composition exhibits a superconducting state at a temperature greater than or equal to 26° K.

134. A method according to claim 133 wherein said transition metal is copper.

135. A method comprising:
applying a magnetic field to cause substantially zero resistance to the flow of electrical current of a material comprising a superconducting current flowing therein, said material comprising a $T_c$ greater than or equal to 26° K;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

136. A method according to claim 135 further including maintaining said material at a temperature less than or equal to said $T_c$ and greater than or equal to 26° K.

137. A method according to claim 136 further including providing a source of current for said superconducting current.

138. A method according to claim 137 wherein said material is maintained at a temperature less than equal to said $T_c$ and greater than or equal to 26° K.

139. A method according to claim 138 said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.
140. A method according to claim 137 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth,
rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper, a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

141. A method according to claim 136 wherein said material is maintained at a temperature less than or equal to said $T_c$ and greater than or equal to 26° K.

142. A method according to claim 141 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide, a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

143. A method according to claim 136 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide, a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

144. A method according to claim 135 further including providing a source of current for said superconducting current.

145. A method according to claim 144 wherein said material is maintained at a temperature less than or equal to said $T_c$ and greater than or equal to 26° K.

146. A method according to claim 145 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1, a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

147. A method according to claim 144 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE, a mixed copper oxide material including an alkaline earth element (AE) and a rare earth or rare earth-like element (RE) where the ratio (AE,RE):Cu is substantially 1:1, a mixed copper oxide material including an alkaline earth element (AE) and a rare earth or rare earth-like element (RE) where the ratio (AE,RE):Cu is substantially 2:1 a structure comprising a distorted octahedral oxygen environment, a distorted orthorhombic crystalline structure, an alkaline earth element substituted for at least one atom of said rare earth, rare earth-like element or rare earth characteristic in said material a transition metal oxide, a mixed transition metal oxide, a copper oxide, a mixed oxide, a mixed oxide with alkaline earth doping, a substituted transition metal oxide, a mixed oxide with alkaline earth-like doping, a copper oxide wherein said alkaline earth or alkaline earth element is atomically large with respect to copper, a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

148. A method according to claim 135 wherein said material is maintained at a temperature less than or equal to said $T_c$ and greater than or equal to 26° K.

149. A structure according to claim 148 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

150. A method according to claim 135 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions, a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE, a mixed copper oxide material including an alkaline earth element (AE) and a rare earth or rare earth-like element (RE) where the ratio (AE,RE):Cu is substantially 1:1, a mixed copper oxide material including an alkaline earth element (AE) and a rare earth or rare earth-like element (RE) where the ratio (AE,RE):Cu is substantially 2:1 a structure comprising a distorted octahedral oxygen environment, a distorted orthorhombic crystalline structure, an alkaline earth element substituted for at least one atom of said rare earth, rare earth-like element or rare earth characteristic in said material a transition metal oxide, a mixed transition metal oxide, a copper oxide, a mixed oxide, a mixed oxide with alkaline earth doping, a substituted transition metal oxide, a mixed oxide with alkaline earth-like doping, a copper oxide wherein said alkaline earth or alkaline earth element is atomically large with respect to copper, a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

151. A method according to claim 135, wherein said transition metal is selected from the group consisting of copper, nickel and chromium.

152. A method according to claim 135 wherein said rare earth-like elements include elements comprising a property which makes it essentially a rare earth element.

153. A method according to claim 135 wherein said composition comprises one or more of Be, Mg, Ca, Sr, Ba, Ra, Sc, Y, La, Ce, Pr, Nd, Pm, Sm, Eu, Gd, Tb, Dy, Ho, Er, Tm, Yb and Lu.

154. A method according to claim 135 wherein said composition comprises one or more of one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

155. A method according to claim 135 wherein said material can be made according to known principles of ceramic science.

156. A method according to claim 135 wherein said material comprises a metallic, oxygen-deficient, perovskite-like, mixed valent transition metal compound.

157. A method according to claim 135 wherein said material comprises a metallic, oxygen-deficient, perovskite-like, mixed valent copper compound.

158. A method according to claim 135 wherein said material comprises a multiphase material wherein at least one phase exhibits superconductivity.

159. A method according to claim 135 wherein said method is a method of operation of a structure capable of magnetic levitation.

160. A method according to claim 135 wherein said material comprises at least one element selected from each of said first element group and said second element group.

161. A method according to claim 135 where in said superconducting current is flowing in a structure selected from the group consisting of a device, an apparatus, a circuit and a combination.

162. A method according to 161 wherein said material possesses substantially zero electrical resistance.

163. A method according to claim 161 wherein said material is part of a circuit element, said circuit element has an input capable of receiving an input current and an output capable of outputting an output current through substantially zero electrical resistance between said input and said output.

164. A method according to claim 163 wherein said material possesses substantially zero electrical resistance.

165. A method according to claim 161 wherein said material is part of a circuit element, said circuit element is designed for said circuit element to be carrying said superconducting current.

166. A method according to claim 165 wherein said material possesses substantially zero electrical resistance.

167. A method according to any claim 161 further including providing said material.

168. A method comprising:
applying a magnetic field to cause substantially zero resistance to the flow of electrical current of a material comprising a superconducting current flowing therein, said material having a $T_c$ greater than or equal to 26° K;
said superconductive property is selected from the group consisting of the magnetic field caused by said superconducting current, the substantially zero resistance to the flow of said superconducting current and combinations thereof;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

169. A method according to claim 168 further including forming said material.

170. A method according to claim 168 further including providing said material.

171. A method comprising:
applying a magnetic field to cause substantially zero resistance to the flow of electrical current of a material comprising a superconducting current flowing therein, said material with a $T_c$ greater than or equal to 26° K;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

172. A method comprising:
applying a magnetic field to cause substantially zero resistance to the flow of electrical current of a material comprising a superconducting current flowing therein, said material possessing a $T_c$ greater than or equal to 26° K;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

173. An method comprising:
providing a composition comprising a transition metal, oxygen and any element selected from the group consisting of a Group IIA element, a rare earth element and a Group III B element, where said composition is a mixed copper oxide having a non-stoichiometric amount of oxygen therein and exhibiting a superconducting state at a temperature greater than or equal to 26° K;
maintaining said composition in said superconducting state at a temperature greater than or equal to 26° K; and
wherein said composition possesses an electrical current passing through said composition while said composition is in said superconducting state.

174. A method according to claim 173 wherein said transition metal is copper.

175. An method comprising:
providing a composition comprising a transition metal, oxygen and (1) a rare earth element or a rare earth-like element or a group III B element, and/or (2) an alkaline earth element or a Group IIA element, where said composition exhibits a superconducting state at a temperature greater than or equal to 26° K;
maintaining said composition in said superconducting state at a temperature greater than or equal to 26° K; and
wherein said composition possesses an electrical current passing through said composition while said composition is in said superconducting state.

176. A method according to claim 175 wherein said transition metal is copper.

177. A method comprising:
providing a material, said material possesses a superconducting current flowing therein, said material comprising a $T_c$ greater than or equal to 26° K
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

178. A method according to claim 177 further including maintaining said material at a temperature less than or equal to said $T_c$ and greater than or equal to 26° K.

179. A method according to claim 178 further including providing a source of current for said superconducting current.

180. A method according to claim 179 wherein said material is maintained at a temperature less than equal to said $T_c$ and greater than or equal to 26° K.

181. A method according to claim 180 said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity, a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

182. A method according to claim 179 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material, a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth,
rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

183. A method according to claim 178 wherein said material is maintained at a temperature less than or equal to said $T_c$ and greater than or equal to 26° K.

184. A method according to claim 183 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure, a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

185. A method according to claim 178 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure, a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

186. A method according to claim 177 further including providing a source of current for said superconducting current.

187. A method according to claim 186 wherein said material is maintained at a temperature less than or equal to said $T_c$ and greater than or equal to 26° K.

188. A method according to claim 187 wherein said material comprises at least one phase which comprises a property selected from the group consisting of:
a layered structure,
a layered crystalline structure,
a substantially layered structure,
a substantially layered crystalline structure,
a layered-like structure, a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_x La_{x-5} Cu_5 O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

189. A method according to claim 186 wherein said material comprises at least one phase which comprises a property selected from the group consisting of:
a layered structure,
a layered crystalline structure,
a substantially layered structure, a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

190. A method according to claim 177 wherein said material is maintained at a temperature less than or equal to said $T_c$ and greater than or equal to 26° K.

191. A structure according to claim 190 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;

a composition comprising a metallic, oxygen-deficient, perovskite-like, mixed valent transition metal compound, and
combinations thereof.

192. A method according to claim 177 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

193. A method according to claim 177 wherein said transition metal is selected from the group consisting of copper, nickel and chromium.

194. A method according to claim 177 wherein said rare earth-like elements include elements comprising a property which makes it essentially a rare earth element.

195. A method according to claim 177 wherein said composition comprises one or more of Be, Mg, Ca, Sr, Ba, Ra, Sc, Y, La, Ce, Pr, Nd, Pm, Sm, Eu, Gd, Tb, Dy, Ho, Er, Tm, Yb and Lu.

196. A method according to claim 177 wherein said composition comprises one or more of one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

197. A method according to claim 177 wherein said material can be made according to known principles of ceramic science.

198. A method according to claim 177 wherein said material comprises a metallic, oxygen-deficient, perovskite-like, mixed valent transition metal compound.

199. A method according to claim 177 wherein said material comprises a metallic, oxygen-deficient, perovskite-like, mixed valent copper compound.

200. A method according to claim 177 wherein said material comprises a multiphase material wherein at least one phase exhibits superconductivity.

201. A method according to claim 177 wherein said method is a method of operation of a structure selected from the group consisting of an apparatus, a device, a circuit and a combination.

202. A method according to claim 177 wherein said material comprises at least one element selected from each of said first element group and said second element group.

203. A method according to claim 177 where in said superconducting current is flowing in a structure selected from the group consisting of a device, an apparatus, a circuit and a combination.

204. A method comprising:

providing a material, said material possesses a superconducting current flowing therein, said material having a $T_c$ greater than or equal to 26° K;

said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

205. A method according to claim 204 further including forming said material.

206. A method comprising:

providing a material, said material possesses a superconducting current flowing therein, said material with a $T_c$ greater than or equal to 26° K;

said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

207. A method comprising:

providing a material, said material possesses a superconducting current flowing therein, said material possessing a $T_c$ greater than or equal to 26° K;

said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

208. An method comprising:

providing a structure comprising a composition comprising a transition metal, oxygen and any element selected from the group consisting of a Group IIA element, a rare earth element and a Group III B element, where said composition is a mixed copper oxide having a nonstoichiometric amount of oxygen therein and exhibiting a superconducting state at a temperature greater than or equal to 26° K;

maintaining said composition in said superconducting state at a temperature greater than or equal to 26° K; and an electrical current passing through said composition while said composition is in said superconducting state.

209. An method comprising:

providing a structure comprising a composition comprising a transition metal, oxygen and (1) a rare earth element or a rare earth-like element or a group III B element, and/or (2) an alkaline earth element or a Group IIA element, where said composition exhibits a superconducting state at a temperature greater than or equal to 26° K;

maintaining said composition in said superconducting state at a temperature greater than or equal to 26° K; and an electrical current passing through said composition while said composition is in said superconducting state.

210. A method according to claim 208 wherein said transition metal is copper.

211. A method according to claim 209 wherein said transition metal is copper.

212. A method comprising:

providing a structure selected from the group consisting of a device, a circuit and an apparatus, said structure comprising a material comprising a $T_c$ greater than or equal to 26° K said material comprises a property selected from the group consisting of being capable of carrying a superconducting current and exhibiting a substantially zero resistance to the flow of electrical current therethrough when in a superconducting state;

said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

213. A method according to claim 212 further including providing a source of cooling said material at a temperature less than or equal to said to said $T_c$.

214. A method according to claim 213 further including providing a source of current for said superconducting current.

215. A method according to claim 214 wherein said material is maintained at a temperature less than equal to said $T_c$ and greater than or equal to 26° K.

216. A method according to claim 215 said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;
a composition comprising a metallic, oxygen-deficient, perovskite-like, mixed valent transition metal compound, and
combinations thereof.

217. A method according to claim 214 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth,
rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

218. A method according to claim 213 wherein said material is maintained at a temperature less than or equal to said $T_c$ and greater than or equal to 26° K.

219. A method according to claim 218 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE, a mixed copper oxide material including an alkaline earth element (AE) and a rare earth or rare earth-like element (RE) where the ratio (AE,RE):Cu is substantially 1:1, a mixed copper oxide material including an alkaline earth element (AE) and a rare earth or rare earth-like element (RE) where the ratio (AE,RE):Cu is substantially 2:1 a structure comprising a distorted octahedral oxygen environment, a distorted orthorhombic crystalline structure, an alkaline earth element substituted for at least one atom of said rare earth, rare earth-like element or rare earth characteristic in said material a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

220. A method according to claim 213 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

221. A method according to claim 212 further including providing a source of current for said superconducting current.

222. A method according to claim 221 wherein said material is maintained at a temperature less than or equal to said $T_c$ and greater than or equal to 26° K.

223. A method according to claim 222 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion,
a composition comprising a metallic, oxygen-deficient, perovskite-like, mixed valent transition metal compound, and
combinations thereof.

224. A method according to claim 221 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states, a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

225. A method according to claim 212 wherein said material is maintained at a temperature less than or equal to said $T_c$ and greater than or equal to 26° K.

226. A structure according to claim 225 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K, at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

227. A method according to claim 212 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

228. A method according to claim 212 wherein said transition metal is selected from the group consisting of copper, nickel and chromium.

229. A method according to claim 212 wherein said rare earth-like elements include elements comprising a property which makes it essentially a rare earth element.

230. A method according to claim 212 wherein said composition comprises one or more of Be, Mg, Ca, Sr, Ba, Ra, Sc, Y, La, Ce, Pr, Nd, Pm, Sm, Eu, Gd, Tb, Dy, Ho, Er, Tm, Yb and Lu.

231. A method according to claim 212 wherein said composition comprises one or more of one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

232. A method according to claim 212 wherein said material can be made according to known principles of ceramic science.

233. A method according to claim 212 wherein said material comprises a metallic, oxygen-deficient, perovskite-like, mixed valent transition metal compound.

234. A method according to claim 212 wherein said material comprises a metallic, oxygen-deficient, perovskite-like, mixed valent copper compound.

235. A method according to claim 212 wherein said material comprises a multiphase material wherein at least one phase exhibits superconductivity.

236. A method according to claim 212 wherein said method is a method of operation of a capable of magnetic levitation.

237. A method according to claim 212 wherein said material comprises at least one element selected from each of said first element group and said second element group.

238. A method according to claim 212 where in said superconducting current is capable of flowing in a structure selected from the group consisting of a device, an apparatus, a circuit and a combination.

239. A method comprising:
providing a structure selected from the group consisting of a device, a circuit and an apparatus, said structure comprising a material having a $T_c$ greater than or equal to 26° K
said material comprises a property selected from the group consisting of being capable of carrying a superconducting current and exhibiting a substantially zero resistance to the flow of electrical current therethrough when in a superconducting state;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

240. A method comprising:
providing a structure selected from the group consisting of a device, a circuit and an apparatus, said structure comprising a material with a $T_c$ greater than or equal to 26° K;
said material comprises a property selected from the group consisting of being capable of carrying a superconducting current and exhibiting a substantially zero resistance to the flow of electrical current therethrough when in a superconducting state;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

241. A method comprising:
providing a structure comprising a material possessing a $T_c$ greater than or equal to 26° K
said material comprises a property selected from the group consisting of being capable of carrying a superconducting current and exhibiting a substantially zero resistance to the flow of electrical current therethrough when in a superconducting state;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

242. A method according to any one of claims 95 to 119 or 120 wherein said superconducting current is flowing in a structure selected from the group consisting of:
a power generation device,
an electrical power transmission device, an electrical power transmission element,
a coil,
a magnet,
a plasma device,
a nuclear device,
a nuclear magnetic resonance device,
a nuclear magnetic imaging device,
a magnetic levitation device,
a power generation system,
a thermonuclear fusion device,
a switching device,
a Josephson junction device,
an electrical packaging device,
a circuit device,
a electronic instrumentation device,
a train,
a magnetic susceptometer, and
a magnetometer.

243. A method according to claim 242 wherein said superconducting current is flowing in a coil comprised of said material.

244. A method according to claim 243 wherein said material possesses substantially zero electrical resistance.

245. A method according to claim 243 wherein said coil possesses substantially zero electrical resistance.

246. A method according to claim 242 wherein said material possesses substantially zero electrical resistance.

247. A method according to claim 242 wherein said material is part of a circuit element, said circuit element has an input capable of receiving an input current and an output capable of outputting an output current through substantially zero electrical resistance between said input and said output.

248. A method according to claim 247 wherein said material possesses substantially zero electrical resistance.

249. A method according to claim 242 wherein said superconducting current flows from an input of a circuit element to an output of said circuit element.

250. A method according to claim 249 wherein said material is part of said circuit element, said circuit element is designed for said circuit element to be capable of carrying said superconducting current.

251. A method according to claim 250 wherein said material possesses substantially zero electrical resistance.

252. A method according claim 242 wherein said material is part of a circuit element, said circuit element is designed for said circuit element to be carrying said superconducting current.

253. A method according to claim 252 wherein said material possesses substantially zero electrical resistance.

254. A method according to claim 242 wherein said material is part of a circuit element, said circuit element is designed for said circuit element to be capable of carrying said superconducting current.

255. A method according to claim 254 wherein said material possesses substantially zero electrical resistance.

256. A method according to claim 242 wherein said material is part of a circuit element, said circuit element is capable of carrying a superconducting current flowing therein through substantially zero electrical resistance.

257. A method according to claim 256 wherein said material possesses substantially zero electrical resistance.

258. A structure according to claim 242 wherein said superconducting current is flowing without a source providing for said superconducting current.

259. A method according to claim 242 further including forming said material.

260. A method according to claim 242 further including providing said material.

261. A method according to any one of claims 95 to 207 wherein said superconducting current is flowing in a coil comprised of said material.

262. A method according to claim 261 wherein said material possesses substantially zero electrical resistance.

263. A method according to claim 262 wherein said material possesses substantially zero electrical resistance.

264. A method according claim 262 wherein said material is part of a circuit element, said circuit element is designed for said circuit element to be carrying said superconducting current.

265. A method according to claim 264 wherein said material possesses substantially zero electrical resistance.

266. A method according to claim 262 further including forming said material.

267. A method according to claim 262 further including providing said material.

268. A method according to claim 261 wherein said coil possesses substantially zero electrical resistance.

269. A method according to claim 268 wherein said material possesses substantially zero electrical resistance.

270. A method according claim 268 wherein said material is part of a circuit element, said circuit element is designed for said circuit element to be carrying said superconducting current.

271. A method according to claim 270 wherein said material possesses substantially zero electrical resistance.

272. A method according to claim 268 further including forming said material.

273. A method according to claim 268 further including providing said material.

274. A method according to claim 261 wherein said coil is carrying said superconducting current flowing therein without a source providing for said superconducting current.

275. A method according to claim 274 further including forming said material.

276. A method according to claim 274 further including providing said material.

277. A method according to claim 261 wherein said material possesses substantially zero electrical resistance.

278. A method according claim 261 wherein said material is part of a circuit element, said circuit element is designed for said circuit element to be carrying said superconducting current.

279. A method according to claim 278 wherein said material possesses substantially zero electrical resistance.

280. A method according to claim 261 further including forming said material.

281. A method according to claim 261 further including providing said material.

282. A method according to any one of claims 95 to 120 or 212 wherein said material possesses substantially zero electrical resistance.

283. A method according to claim 282 further including forming said material.

284. A method according to claim 282 further including providing said material.

285. A method according to any one of claims 95 to 120 wherein said material is part of a circuit element, said circuit element has an input capable of receiving an input current and an output capable of outputting an output current through substantially zero electrical resistance between said input and said output.

286. A method according to claim 285 wherein said material possesses substantially zero electrical resistance.

287. A method according to claim 286 further including forming said material.

288. A method according to claim 286 further including providing said material.

289. A method according to claim 285 further including forming said material.

290. A method according to claim 285 further including providing said material.

291. A method according to any one of claims 95 to 120 wherein said superconducting current flows from an input of a circuit element to an output of said circuit element.

292. A method according to claim 291 wherein said material possesses substantially zero electrical resistance.

293. A method according to claim 292 further including forming said material.

294. A method according to claim 292 further including providing said material.

295. A method according to claim 291 wherein said material is part of said circuit element, said circuit element is designed for said circuit element to be capable of carrying said superconducting current.

296. A method according to claim 295 further including forming said material.

297. A method according to claim 295 wherein said material possesses substantially zero electrical resistance.

298. A method according to claim 297 further including forming said material.

299. A method according to claim 297 further including providing said material.

300. A method according to claim 295 further including providing said material.

301. A method according to claim 291 further including forming said material.

302. A method according to claim 291 further including providing said material.

303. A method according to any one of claims 95 to 120 wherein said material is part of a circuit element, said circuit element is designed for said circuit element to be carrying said superconducting current.

304. A method according to claim 303 wherein said material possesses substantially zero electrical resistance.

305. A method according to claim 304 further including forming said material.

306. A method according to claim 304 further including providing said material.

307. A method according to claim 303 further including forming said material.

308. A method according to claim 303 further including providing said material.

309. A method according to any one of claims 95 to 120 wherein said material is part of a circuit element, said circuit element is designed for said circuit element to be capable of carrying said superconducting current.

310. A method according to claim 309 wherein said material possesses substantially zero electrical resistance.

311. A method according to claim 310 further including forming said material.

312. A method according to claim 310 further including providing said material.

313. A method according to claim 309 further including forming said material.

314. A method according to claim 309 further including providing said material.

315. A method according to any one of claims 95 to 120 wherein said material is part of a circuit element, said circuit element is capable of carrying a superconducting current flowing therein through substantially zero electrical resistance.

316. A method according to claim 315 wherein said material possesses substantially zero electrical resistance.

317. A method according to claim 316 further including forming said material.

318. A method according to claim 316 further including providing said material.

319. A method according to claim 315 further including forming said material.

320. A method according to claim 315 further including providing said material.

321. A structure according to any one of claims 95 to 120 wherein said superconducting current is flowing without a source providing for said superconducting current.

322. A method according to claim 321 further including forming said material.

323. A method according to claim 321 further including providing said material.

324. A method according to any one of claims 95, 128, 129 or 130 wherein said rare earth-like elements include elements comprising a property which makes it essentially a rare earth element.

325. A method according to claim 324 further including forming said material.

326. A method according to claim 324 further including providing said material.

327. A method according to any one of claims 95 to 120, 228, 229 or 230 further including forming said material.

328. A method according to any one of claims 95 to 120, 128, 129 or 130 further including providing said material.

329. A method according to any one of claims 95, 128, 129 or 130 wherein said superconducting current will substantially persist indefinitely unchanged in magnitude as long as superconductivity remains.

330. A method according to any one of claims 95, 128, 129 or 130 wherein said superconducting current will substantially persist indefinitely unchanged in magnitude as long as superconductivity remains.

331. A method according to any one of claims 135 to 159 or 160 wherein said superconducting current is flowing in a structure selected from the group consisting of:
a power generation device,
an electrical power transmission device,
an electrical power transmission element,
a coil,
a magnet,
a plasma device,
a nuclear device,
a nuclear magnetic resonance device,
a nuclear magnetic imaging device,
a magnetic levitation device,
a power generation system,
a thermonuclear fusion device,
a switching device,
a Josephson junction device,
an electrical packaging device,
a circuit device,
a electronic instrumentation device,
a train,
a magnetic susceptometer, and
a magnetometer.

332. A method according to claim 331 wherein said superconducting current is flowing in a coil comprised of said material.

333. A method according to claim 332 wherein said material possesses substantially zero electrical resistance.

334. A method according to claim 332 wherein said coil possesses substantially zero electrical resistance.

335. A method according to 331 wherein said material possesses substantially zero electrical resistance.

336. A method according to claim 331 wherein said material is part of a circuit element, said circuit element has an input capable of receiving an input current and an output capable of outputting an output current through substantially zero electrical resistance between said input and said output.

337. A method according to claim 336 wherein said material possesses substantially zero electrical resistance.

338. A method according to claim 331 wherein said material is part of a circuit element, said circuit element is designed for said circuit element to be carrying said superconducting current.

339. A method according to claim 338 wherein said material possesses substantially zero electrical resistance.

340. A method according to claim 331 wherein said material is part of a circuit element, said circuit element is designed for said circuit element to be capable of carrying said superconducting current.

341. A method according to claim 331 wherein said material is part of a circuit element, said circuit element is capable of carrying a superconducting current flowing therein through substantially zero electrical resistance.

342. A method according to claim 341 wherein said material possesses substantially zero electrical resistance.

343. A method according to claim 331 wherein said superconducting current is flowing without a source providing for said superconducting current.

344. A method according to any claim 331 further including providing said material.

345. A method according to any one of claims 135 to 160 wherein said superconducting current is flowing in a coil comprised of said material.

346. A method according to claim 345 wherein said material possesses substantially zero electrical resistance.

347. A method according to claim 346 wherein said material possesses substantially zero electrical resistance.

348. A method according to claim 347 further including forming said material.

349. A method according to claim 347 further including providing said material.

350. A method according to 346 wherein said material possesses substantially zero electrical resistance.

351. A method according to claim 346 wherein said material is part of a circuit element, said circuit element has an input capable of receiving an input current and an output capable of outputting an output current through substantially zero electrical resistance between said input and said output.

352. A method according to claim 351 wherein said material possesses substantially zero electrical resistance.

353. A method according to claim 346 wherein said material is part of a circuit element, said circuit element is designed for said circuit element to be carrying said superconducting current.

354. A method according to claim 353 wherein said material possesses substantially zero electrical resistance.

355. A method according to any claim 346 further including providing said material.

356. A method according to claim 345 wherein said coil possesses substantially zero electrical resistance.

357. A method according to claim 356 wherein said material possesses substantially zero electrical resistance.

358. A method according to claim 356 wherein said material is part of a circuit element, said circuit element has an input capable of receiving an input current and an output capable of outputting an output current through substantially zero electrical resistance between said input and said output.

359. A method according to claim 358 wherein said material possesses substantially zero electrical resistance.

360. A method according to claim 356 wherein said material is part of a circuit element, said circuit element is designed for said circuit element to be carrying said superconducting current.

361. A method according to claim 360 wherein said material possesses substantially zero electrical resistance.

362. A method according to any claim 356 further including providing said material.

363. A method according to claim 345 wherein said coil is carrying said superconducting current flowing therein without a source providing for said superconducting current.

364. A method according to claim 363 further including forming said material.

365. A method according to claim 363 further including providing said material.

366. A method according to 345 wherein said material possesses substantially zero electrical resistance.

367. A method according to claim 345 wherein said material is part of a circuit element, said circuit element has an input capable of receiving an input current and an output capable of outputting an output current through substantially zero electrical resistance between said input and said output.

368. A method according to claim 367 wherein said material possesses substantially zero electrical resistance.

369. A method according to claim 345 wherein said material is part of a circuit element, said circuit element is designed for said circuit element to be carrying said superconducting current.

370. A method according to claim 369 wherein said material possesses substantially zero electrical resistance.

371. A method according to any claim 345 further including providing said material.

372. A method according to any one of claims 135 to 160 wherein said material possesses substantially zero electrical resistance.

373. A method according to claim 372 further including forming said material.

374. A method according to claim 372 further including providing said material.

375. A method according to any one of claims 135 to 160 wherein said material is part of a circuit element, said circuit element has an input capable of receiving an input current and an output capable of outputting an output current through substantially zero electrical resistance between said input and said output.

376. A method according to claim 375 wherein said material possesses substantially zero electrical resistance.

377. A method according to claim 376 further including forming said material.

378. A method according to claim 376 further including providing said material.

379. A method according to claim 375 further including forming said material.

380. A method according to claim 375 further including providing said material.

381. A method according to any one of claims 135 to 150 or 143 wherein said superconducting current flows from an input of a circuit element to an output of said circuit element.

382. A method according to claim 381 further including providing said material.

383. A method according to claim 381 wherein said material possesses substantially zero electrical resistance.

384. A method according to claim 383 further including forming said material.

385. A method according to claim 383 further including providing said material.

386. A method according to claim 381 wherein said material is part of said circuit element, said circuit element is designed for said circuit element to be capable of carrying said superconducting current.

387. A method according to claim 386 wherein said material possesses substantially zero electrical resistance.

388. A method according to claim 387 further including forming said material.

389. A method according to claim 387 further including providing said material.

390. A method according to claim 386 further including forming said material.

391. A method according to claim 386 further including providing said material.

392. A method according to claim 381 further including forming said material.

393. A method according to any one of claims 135 to 160 wherein said material is part of a circuit element, said circuit element is designed for said circuit element to be carrying said superconducting current.

394. A method according to claim 393 further including providing said material.

395. A method according to claim 393 wherein said material possesses substantially zero electrical resistance.

396. A method according to claim 395 further including forming said material.

397. A method according to claim 395 further including providing said material.

398. A method according to claim 393 further including forming said material.

399. A method according to claim 135 to 160 wherein said material is part of a circuit element, said circuit element is designed for said circuit element to be capable of carrying said superconducting current.

400. A method according to claim 399 further including forming said material.

401. A method according to claim 399 further including providing said material.

402. A method according to any one of claims 135 to 160 wherein said material is part of a circuit element, said circuit element is capable of carrying a superconducting current flowing therein through substantially zero electrical resistance.

403. A method according to claim 402 wherein said material possesses substantially zero electrical resistance.

404. A method according to claim 403 further including forming said material.

405. A method according to claim 403 further including providing said material.

406. A method according to claim 402 further including forming said material.

407. A method according to claim 402 further including providing said material.

408. A method according to any one of claims 135 to 160 wherein said superconducting current is flowing without a source providing for said superconducting current.

409. A method according to claim 408 further including forming said material.

410. A method according to claim 408 further including providing said material.

411. A method according to any one of claims 135, 171 or 172 wherein said rare earth-like elements include elements comprising a property which makes it essentially a rare earth element.

412. A method according to any one of claims 135 to 356 or 161 further including forming said material.

413. A method according to any one of claims 135 to 106 further including providing said material.

414. A method according to any one of claims 177 to 201 or 202 wherein said superconducting current is flowing in a structure selected from the group consisting of:
a power generation device,
an electrical power transmission device,
an electrical power transmission element,
a coil,
a magnet,
a plasma device,
a nuclear device,
a nuclear magnetic resonance device,
a nuclear magnetic imaging device,
a magnetic levitation device,
a power generation system,
a thermonuclear fusion device,
a switching device,
a Josephson junction device,
an electrical packaging device,
a circuit device,
a electronic instrumentation device,
a train,
a magnetic suceptomoter, and
a magnetometer.

415. A method according to claim 414 wherein said superconducting current is flowing in a coil comprised of said material.

416. A method according to claim 415 wherein said material possesses substantially zero electrical resistance.

417. A method according to claim 415 wherein said coil possesses substantially zero electrical resistance.

418. A method according to claim 414 wherein said material possesses substantially zero electrical resistance.

419. A method according to claim 414 wherein said material is part of a circuit element, said circuit element has an input capable of receiving an input current and an output capable of outputting an output current through substantially zero electrical resistance between said input and said output.

420. A method according to claim 419 wherein said material possesses substantially zero electrical resistance.

421. A method according claim 414 wherein said material is part of a circuit element, said circuit element is designed for said circuit element to be carrying said superconducting current.

422. A method according to claim 414 wherein said material possesses substantially zero electrical resistance.

423. A method according to claim 414 wherein said material is part of a circuit element, said circuit element is designed for said circuit element to be capable of carrying said superconducting current.

424. A method according to claim 414 wherein said material is part of a circuit element, said circuit element is capable of carrying a superconducting current flowing therein through substantially zero electrical resistance.

425. A method according to claim 424 wherein said material possesses substantially zero electrical resistance.

426. A method according to claim 414 wherein said superconducting current is flowing without a source providing for said superconducting current.

427. A method according to claim 414 further including forming said material.

428. A method according to any one of claims 177 to 202 wherein said superconducting current is flowing in a coil comprised of said material.

429. A method according to claim 428 wherein said material possesses substantially zero electrical resistance.

430. A method according to claim 429 wherein said material possesses substantially zero electrical resistance.

431. A method according to claim 430 further including forming said material.

432. A method according to claim 429 wherein said material possesses substantially zero electrical resistance.

433. A method according claim 429 wherein said material is part of a circuit element, said circuit element is designed for said circuit element to be carrying said superconducting current.

434. A method according to claim 429 wherein said material possesses substantially zero electrical resistance.

435. A method according to claim 429 further including forming said material.

436. A method according to claim 428 wherein said coil possesses substantially zero electrical resistance.

437. A method according to claim 436 wherein said material possesses substantially zero electrical resistance.

438. A method according claim 436 wherein said material is part of a circuit element, said circuit element is designed for said circuit element to be carrying said superconducting current.

439. A method according to claim 436 wherein said material possesses substantially zero electrical resistance.

440. A method according to claim 436 further including forming said material.

441. A method according to claim 428 wherein said coil is carrying said superconducting current flowing therein without a source providing for said superconducting current.

442. A method according to claim 441 further including forming said material.

443. A method according to claim 428 wherein said material possesses substantially zero electrical resistance.

444. A method according claim 428 wherein said material is part of a circuit element, said circuit element is designed for said circuit element to be carrying said superconducting current.

445. A method according to claim 428 wherein said material possesses substantially zero electrical resistance.

446. A method according to claim 428 further including forming said material.

447. A method according to any one of claims 177 to 202 or 390 wherein said material possesses substantially zero electrical resistance.

448. A method according to claim 447 further including forming said material.

449. A method according to claim 447 further including forming said material.

450. A method according to any one of claims 177 to 202 wherein said material is part of a circuit element, said circuit element has an input capable of receiving an input current and an output capable of outputting an output current through substantially zero electrical resistance between said input and said output.

451. A method according to claim 450 wherein said material possesses substantially zero electrical resistance.

452. A method according to claim 451 further including forming said material.

453. A method according to claim 450 further including forming said material.

454. A method according to any one of claims 177 to 192 or 185 wherein said superconducting current flows from an input of a circuit element to an output of said circuit element.

455. A method according to claim 454 wherein said material possesses substantially zero electrical resistance.

456. A method according to claim 455 further including forming said material.

457. A method according to claim 454 wherein said material is part of said circuit element, said circuit element is designed for said circuit element to be capable of carrying said superconducting current.

458. A method according to claim 457 wherein said material possesses substantially zero electrical resistance.

459. A method according to claim 458 further including forming said material.

460. A method according to claim 457 further including forming said material.

461. A method according to claim 454 further including forming said material.

462. A method according to any one of claims 177 to 202 or 203 wherein said material is part of a circuit element, said circuit element is designed for said circuit element to be carrying said superconducting current.

463. A method according to claim 462 wherein said material possesses substantially zero electrical resistance.

464. A method according to claim 463 further including forming said material.

465. A method according to claim 462 further including forming said material.

466. A method according to any one of claims 177 to 202 wherein said material is part of a circuit element, said circuit element is designed for said circuit element to be capable of carrying said superconducting current.

467. A method according to claim 466 further including forming said material.

468. A method according to any one of claims 177 to 202 wherein said material is part of a circuit element, said circuit element is capable of carrying a superconducting current flowing therein through substantially zero electrical resistance.

469. A method according to claim 468 wherein said material possesses substantially zero electrical resistance.

470. A method according to claim 469 further including forming said material.

471. A method according to claim 468 further including forming said material.

472. A method according to any one of claims 177 to 202 wherein said superconducting current is flowing without a source providing for said superconducting current.

473. A method according to claim 472 further including forming said material.

474. A method according to any one of claims 177, 204, 206 or 207 wherein said rare earth-like elements include elements comprising a property which makes it essentially a rare earth element.

475. A method according to any one of claims 177 to 202 or 203 further including forming said material.

476. A method according to any one of claims 135, 168, 171, 172, 177, 204, 206, or 207 wherein said superconducting current will substantially persist indefinitely unchanged in magnitude as long as superconductivity remains.

477. A method according to any one of claims 135, 168, 171, 172, 177, 204, 206, or 207 wherein said superconducting current will substantially persist indefinitely unchanged in magnitude as long as superconductivity remains.

478. A method according to any one of claims 212 to 236 or 237 wherein said superconducting current is capable of flowing in a structure selected from the group consisting of:
- a power generation device,
- an electrical power transmission device,
- an electrical power transmission element,
- a coil,
- a magnet,
- a plasma device,
- a nuclear device,
- a nuclear magnetic resonance device,
- a nuclear magnetic imaging device,
- a magnetic levitation device,
- a power generation system,
- a thermonuclear fusion device,
- a switching device,
- a Josephson junction device,
- an electrical packaging device,
- a circuit device,
- a electronic instrumentation device,
- a train
- a magnetic suceptomoter, and
- a magnetometer.

479. A method according to claim 478 wherein said superconducting current is capable of flowing in a coil comprised of said material.

480. A method according to claim 479 wherein said material possesses substantially zero electrical resistance.

481. A method according to claim 479 wherein said coil possesses substantially zero electrical resistance.

482. A method according to claim 478 wherein said material possesses substantially zero electrical resistance.

483. A method according to claim 478 wherein said material is part of a circuit element, said circuit element has an input capable of receiving an input current and an output capable of outputting an output current through substantially zero electrical resistance between said input and said output.

484. A method according to claim 483 wherein said material possesses substantially zero electrical resistance.

485. A method according to claim 478 wherein said material is part of a circuit element, said circuit element is designed for said circuit element to be carrying said superconducting current.

486. A method according to claim 478 wherein said material possesses substantially zero electrical resistance.

487. A method according to claim 478 wherein said material is part of a circuit element, said circuit element is designed for said circuit element to be capable of carrying said superconducting current.

488. A method according to claim 478 wherein said material is part of a circuit element, said circuit element is capable of carrying a superconducting current flowing therein through substantially zero electrical resistance.

489. A method according to claim 478 wherein said superconducting current is capable of flowing without a source providing for said superconducting current.

490. A method according to any one of claims 212 to 237 wherein said superconducting current is capable of flowing in a coil comprised of said material.

491. A method according to claim 490 wherein said material possesses substantially zero electrical resistance.

492. A method according to claim 491 wherein said material possesses substantially zero electrical resistance.

493. A method according to claim 491 wherein said material possesses substantially zero electrical resistance.

494. A method according to claim 491 wherein said material is part of a circuit element, said circuit element is designed for said circuit element to be carrying said superconducting current.

495. A method according to claim 491 wherein said material possesses substantially zero electrical resistance.

496. A method according to claim 490 wherein said coil possesses substantially zero electrical resistance.

497. A method according to claim 496 wherein said material possesses substantially zero electrical resistance.

498. A method according to claim 496 wherein said material is part of a circuit element, said circuit element is designed for said circuit element to be carrying said superconducting current.

499. A method according to claim 496 wherein said material possesses substantially zero electrical resistance.

500. A method according to claim 490 wherein said coil is capable of carrying said superconducting current flowing therein without a source providing for said superconducting current.

501. A method according to claim 490 wherein said material possesses substantially zero electrical resistance.

502. A method according to claim 490 wherein said material is part of a circuit element, said circuit element is designed for said circuit element to be carrying said superconducting current.

503. A method according to claim 490 wherein said material possesses substantially zero electrical resistance.

504. A method according to any one of claims 212 to 237 or 238 wherein said material possesses substantially zero electrical resistance.

505. A method according to any one of claims 212 to 237 wherein said material is part of a circuit element, said circuit element has an input capable of receiving an input current and an output capable of outputting an output current through substantially zero electrical resistance between said input and said output.

506. A method according to claim 505 wherein said material possesses substantially zero electrical resistance.

507. A method according to any one of claims 212 to 227 or 220 wherein said superconducting is capable of flowing from an input of a circuit element to an output of said circuit element.

508. A method according to claim 507 wherein said material possesses substantially zero electrical resistance.

509. A method according to claim 507 wherein said material is part of said circuit element, said circuit element is designed for said circuit element to be capable of carrying said superconducting current.

510. A method according to claim 509 wherein said material possesses substantially zero electrical resistance.

511. A method according to any one of claims 212 to 237 or 238 wherein said material is part of a circuit element, said circuit element is designed for said circuit element to be carrying said superconducting current.

512. A method according to claim 511 wherein said material possesses substantially zero electrical resistance.

513. A method according to any one of claims 212 to 237 wherein said material is part of a circuit element, said circuit element is designed for said circuit element to be capable of carrying said superconducting current.

514. A method according to any one of claims 212 to 237 wherein said material is part of a circuit element, said circuit element is capable of carrying a superconducting current flowing therein through substantially zero electrical resistance.

515. A method according to claim 514 wherein said material possesses substantially zero electrical resistance.

516. A method according to claim 514 wherein said material possesses substantially zero electrical resistance.

517. A method according to any one of claims 212 to 237 wherein said superconducting current is capable of flowing without a source providing for said superconducting current.

518. A method according to any one of claims 212, 239, 240 or 241 wherein said rare earth-like elements include elements comprising a property which makes it essentially a rare earth element.

519. A method according to any one of 212, 239, 240 or 241 wherein said superconducting current will substantially persist indefinitely unchanged in magnitude as long as superconductivity remains.

520. A method according to any one of claims 212, 239, 240 or 241 wherein said superconducting current will substantially persist indefinitely unchanged in magnitude as long as superconductivity remains in a coil of said material.

521. A method according to any one of claims 212, 239, 240 or 241 wherein said method comprises a method of fabricating said structure is in a manufacturing method.

* * * * *